(12) United States Patent
Sasaki et al.

(10) Patent No.: US 8,187,726 B2
(45) Date of Patent: May 29, 2012

(54) NANOPARTICLE-RESIN COMPOSITE MATERIAL, LIGHT EMITTING DEVICE ASSEMBLY, AND FILLING MATERIAL FOR THE LIGHT-EMITTING DEVICE ASSEMBLY

(75) Inventors: Yuuichi Sasaki, Miyagi (JP); Mikihisa Mizuno, Miyagi (JP); Sung-kil Lee, Miyagi (JP); Hitoshi Katakura, Miyagi (JP); Teiichi Miyauchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 1287 days.

(21) Appl. No.: 11/463,410

(22) Filed: Aug. 9, 2006

(65) Prior Publication Data

US 2007/0036962 A1  Feb. 15, 2007

(30) Foreign Application Priority Data

Aug. 9, 2005 (JP) .............. P2005-230606
May 10, 2006 (JP) .............. P2006-131672
May 15, 2006 (JP) .............. P2006-135044

(51) Int. Cl.
*H01L 51/54* (2006.01)
(52) U.S. Cl. ........ 428/690; 428/917; 313/504; 313/506; 252/301.16; 252/301.21; 252/301.35; 257/40; 257/100
(58) Field of Classification Search .................. 428/323, 428/446, 690; 257/98; 313/112, 512
See application file for complete search history.

(56) References Cited

U.S. PATENT DOCUMENTS

| | | | |
|---|---|---|---|
| 2001/0018044 A1* | 8/2001 | Nakanishi et al. | 424/59 |
| 2002/0041927 A1* | 4/2002 | Nojiri et al. | 427/212 |
| 2003/0207129 A1* | 11/2003 | Kambe et al. | 428/447 |
| 2003/0227249 A1* | 12/2003 | Mueller et al. | 313/491 |

FOREIGN PATENT DOCUMENTS

| | | | |
|---|---|---|---|
| JP | 200415063 | | 1/2004 |
| JP | 2004537767 | | 12/2004 |
| JP | 20055740 | | 1/2005 |
| JP | 2006082998 | * | 3/2006 |
| WO | WO03013846 A1 | | 2/2003 |
| WO | WO 2005/033207 A1 | * | 4/2005 |

OTHER PUBLICATIONS

Mills J. Phys E: Sci. Instrum. p. 1043 2nd col. section 3.2 and p. 1043 Section 2 col. 1.*
Steranka et al., High Power LEDs-Technology Status and Market Applications by WILEY-VCH Verlag GmbH & Co. KGaA, Weinheim, phys. stat. sol. (a) vol. 194, No. 2 (2002). pp. 380-388.

* cited by examiner

*Primary Examiner* — Jennifer Chriss
*Assistant Examiner* — Michael H Wilson
(74) *Attorney, Agent, or Firm* — K&L Gates LLP

(57) ABSTRACT

A nanoparticle-resin composite material is provided. The material has a transparent characteristic and a refractive index of at least 1.55 in the visible light region. The composite material includes inorganic nanoparticles dispersed in a polymer having a siloxane bond, the inorganic nanoparticles being coated with an organic compound. The organic compound is at least one compound selected from the group consisting of carboxylic acids, phosphinic acid, phosphonic acid, sulfinic acid, sulfonic acid, and thiols, and the selected compound contains an aryl group or an aryloxy group. The polymer is selected from the group consisting of methylphenyl polysiloxane, methylphenyl hydrogen polysiloxane, a mixture methylphenyl polysiloxane and methylphenyl hydrogen polysiloxane, or methylphenyl polysiloxane, methylphenyl hydrogen polysiloxane, and a mixture of methylphenyl polysiloxane and methylphenyl hydrogen polysiloxane. Parts of the side chains and/or terminals of the methylphenyl polysiloxane and the methylphenyl hydrogen polysiloxane are substituted by epoxy groups, carboxyl groups, carbinol groups, methacryl groups, polyether groups, or vinyl groups.

16 Claims, 3 Drawing Sheets

NANOPARTICLE-RESIN COMPOSITE MATERIAL, LIGHT EMITTING DEVICE ASSEMBLY, AND FILLING MATERIAL FOR THE LIGHT-EMITTING DEVICE ASSEMBLY

CROSS REFERENCES TO RELATED APPLICATIONS

The present application claims priority to Japanese Patent application JP 2005-230606 filed in the Japanese Patent Office on Aug. 9, 2005, Japanese Patent Application JP 2006-135044 filed in the Japanese Patent Office on May 15, 2006, and Japanese Patent Application JP 2006-131672 filed in the Japanese Patent Office on May 10, 2006, the entire contents of which are incorporated herein by reference.

BACKGROUND

The present application relates to a nanoparticle-resin composite material having transparency and a high refractive index in the visible light region and containing inorganic nanoparticles and a polymer or inorganic nanoparticles and a crosslinked product having a siloxane bond. Furthermore, the invention relates to a light-emitting device assembly using the nanoparticle-resin composite material and a filling material for the light-emitting device assembly.

Light-emitting device assemblies including light-emitting diodes (LED) or laser diodes (LD) have high luminance in spite of their small sizes, and are thus used in various applications, such as automobile stop lamps, signal lamps, field large displays, and the like. Such light-emitting device assemblies have recently been used as light sources for backlight of liquid crystal displays for cellular phones and large liquid crystal televisions because of the low power consumption and long lifetime.

In order to prevent direct contact of light-emitting devices and wiring with moisture and other corrosive gases and to further prevent physical damage to the light-emitting devices due to external force, light-emitting device assemblies generally have a structure in which, for example, as shown in FIG. 4, a sealing member 114 having an appropriate thickness is disposed on or above a light-emitting device 12. The sealing member 114 is generally composed of a transparent resin, such as an epoxy resin, a silicone resin, or an acrylic resin. However, usual light-emitting device assemblies have a large difference between the refractive indexes of the light-emitting device 12 and the sealing member 114 and thus has the problem that the efficiency of light emission is decreased by total reflection of part of light emitted from the light-emitting device 12 at the interface between the light-emitting device 12 and the sealing member 114 and re-absorption of the totally reflected light by the light-emitting device 12. In FIG. 4, reference numeral 11 denotes a reflection cup.

In order to solve this problem, Japanese Unexamined Patent Application Publication No. 2004-15063 discloses a technique in which nanoparticles having a particle diameter smaller than the wavelength of emitted light and a higher refractive index than that of a matrix resin are dispersed in the matrix resin to bring the effective refractive index of the resultant material near to that of a light-emitting device. In addition, Japanese Unexamined Patent Application Publication No. 2005-5740 discloses a resin material (sealing material) containing a resin and a filler such as titanium oxide or glass. Furthermore, PCT Japanese Translation Patent Publication No. 2004-537767 discloses an optical structure in which inorganic nanoparticles are blended with a polymer to control the refractive index.

As described above, a sealing member constituting a light-emitting device assembly is composed of an epoxy resin, a silicone resin, an acrylic resin, or the like, but an epoxy resin is frequently used. However, some problems to be resolved have been pointed out on resins for high-power light-emitting devices which have recently been in increasing demand. In Phys. Stat. Sol. (a) 194, No. 2, 380-388 (2002), it has been reported that epoxy resins have glass transition temperatures Tg of 100° C. to 150° C., and linear expansion coefficients increase above the glass transition temperatures $T_g$. When an epoxy resin is heated to the glass transition temperature $T_g$ or more due to the heat generated in a light-emitting device, wiring connected to the light-emitting device may be disconnected. Therefore, the output of a light-emitting device is desirably limited to avoid the epoxy resin from being heated to the glass transition temperature $T_g$ or more due to the heat generated in the light-emitting device. Furthermore, epoxy resins are discolored to yellow when being exposed to blue light, and thus the output from a light-emitting device assembly decreases with the passage of time. Therefore, silicone resins have recently been used as an alternative to epoxy resins.

However, Japanese Unexamined Patent Application Publication No. 2004-15063 discloses examples of combination of a matrix resin and nanoparticles in which the nanoparticles are dispersed in the matrix resin. In order to uniformly disperse the nanoparticles of several nanometers in the matrix resin without aggregation, for example, the nanoparticles may be chemically surface-treated for improving the affinity between the nanoparticles and the matrix resin. However, Japanese Unexamined Patent Application Publication No. 2004-15063 does not disclose such a technique. Also, Japanese Unexamined Patent Application Publication No. 2005-5740 does not disclose a technique for uniformly mixing a resin with a filler such as titanium oxide or glass without aggregation. PCT Japanese Translation Publication No. 2004-537767 shows an idea that a linker is used for activating the surfaces of inorganic nanoparticles, in order to disperse the inorganic nanoparticles in a polymer. However, this publication does not suggest a specific technique for properly dispersing the inorganic nanoparticles in the silicone polymer.

Silicone resins have excellent light resistance and are capable of suppressing a decrease in power in the use of blue light. Also, silicon resins have appropriate flexibility and are thus capable of suppressing an increase in stress even at high temperatures. However, silicon resins which are used in practical applications have reflective indexes of at most about 1.5 and are thus desired to have higher reflective indexes from the viewpoint of improvement in the efficiency of light emission.

Accordingly, it is desired to provide a nanoparticle-resin composite material (a composite material including inorganic nanoparticles and a polymer) having transparency and a reflective index of 1.55 or more in the visible light region, a light-emitting device assembly including the nanoparticle-resin composite material, and a filling material for the light-emitting device assembly.

SUMMARY

According to first and second embodiments, a nanoparticle-resin composite material has transparency and a refractive index of 1.55 or more in the visible light region and includes inorganic nanoparticles dispersed in a polymer having siloxane bonds (Si—O—Si bonds), wherein the inorganic nanoparticles are coated with an organic compound.

In the nanoparticle-resin composite material according to the first embodiment of the invention, the organic compound is at least one compound selected from the group consisting of carboxylic acids, phosphinic acid, phosphonic acid, sulfinic acid, sulfonic acid, and thiols, and the selected compound contains an aryl group or an aryloxy group.

The polymer is methylphenyl polysiloxane, methylphenyl hydrogen polysiloxane, or a mixture of methylphenyl polysiloxane and methylphenyl hydrogen polysiloxane. The polymer may be methylphenyl polysiloxane, methylphenyl hydrogen polysiloxane, or a mixture of methylphenyl polysiloxane and methylphenyl hydrogen polysiloxane, parts of the side chains and/or the terminals of the methylphenyl polysiloxane and the methylphenyl hydrogen polysiloxane being substituted by epoxy groups, carboxyl groups, carbinol groups, methacryl groups, polyether groups, or vinyl groups.

When the polymer is methylphenyl polysiloxane, methylphenyl hydrogen polysiloxane, a mixture of methylphenyl polysiloxane and methylphenyl hydrogen polysiloxane, the nanoparticle-resin composite material according to the first embodiment of the invention may be referred to as the "nanoparticle-resin composite material according to embodiment 1A of the invention" for the sake of convenience. When the polymer is methylphenyl polysiloxane, methylphenyl hydrogen polysiloxane, a mixture of methylphenyl polysiloxane and methylphenyl hydrogen polysiloxane, parts of the side chains and/or the terminals of the methylphenyl polysiloxane and the methylphenyl hydrogen polysiloxane being substituted by epoxy groups, carboxyl groups, carbinol groups, methacryl groups, polyether groups, or vinyl groups, the nanoparticle-resin composite material according to the first embodiment of the invention may be referred to as the "nanoparticle-resin composite material according to embodiment 1B of the invention" for the sake of convenience.

The methylphenyl polysiloxane is represented by general formula (1A-01) below, and the methylphenyl hydrogen polysiloxane is represented by general formula (1B-01) below. In the general formula (1A-01), $R^1$ represents a monovalent hydrocarbon group other than a phenyl group, $R^2$ represents a phenyl group, a represents an integer of 1 or more, and b represents an integer of 1 or more. In the general formula (1B-01), $R^1$ represents a monovalent hydrocarbon group other than a phenyl group, R2 represents a phenyl group, a represents an integer of 1 or more, b represents an integer of 1 or more, and c represents an integer of 1 or more.

$$R^1{}_a R^2{}_b SiO_{\{4-(a+b)\}/2} \quad (1A\text{-}01)$$

$$R^1{}_a R^2{}_b H_c SiO_{\{4-(a+b+c)\}/2} \quad (1B\text{-}01)$$

The methylphenyl polysiloxane in which the side chains are partially substituted is represented by general formula (1B-11) below; the methylphenyl hydrogen polysiloxane in which the side chains are partially substituted, general formula (1B-12) below; the methylphenyl polysiloxane in which the terminals are substituted, general formula (1B-13) below; and the methylphenyl hydrogen polysiloxane in which the terminals are substituted, formula (1B-14) below. In the general formula (1 B-11), $R^1$ represents a monovalent hydrocarbon group other than a phenyl group, R2 represents a phenyl group, X represents an epoxy group, a carboxyl group, a carbinol group, a methacryl group, a polyether group, or a vinyl group, w represents an integer of 1 or more, x represents an integer of 1 or more, y represents an integer of 1 or more, and a represents 0 or an integer of 1 or more. In the general formula (1B-12), $R^1$ represents a monovalent hydrocarbon group other than a phenyl group, $R^2$ represents a phenyl group, X represents an epoxy group, a carboxyl group, a carbinol group, a methacryl group, a polyether group, or a vinyl group, w represents an integer of 1 or more, x represents an integer of 1 or more, y represents an integer of 1 or more, z represents an integer of 1 or more, and a represents 0 or an integer of 1 or more. In the general formula (1B-13), $R^1$ represents a monovalent hydrocarbon group other than a phenyl group, $R^1$ represents a phenyl group, Y represents an epoxy group, a carboxyl group, a carbinol group, a methacryl group, a polyether group, or a vinyl group, w represents an integer of 1 or more, x represents an integer of 1 or more, and y represents an integer of 1 or more. In the general formula (1B-14), $R^1$ represents a monovalent hydrocarbon group other than a phenyl group, $R^2$ represents a phenyl group, Y represents an epoxy group, a carboxyl group, a carbinol group, a methacryl group, a polyether group, or a vinyl group, w represents an integer of 1 or more, x represents an integer of 1 or more, y represents an integer of 1 or more, and z represents an integer of 1 or more.

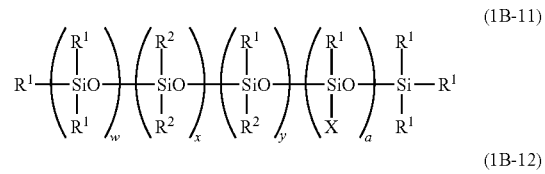

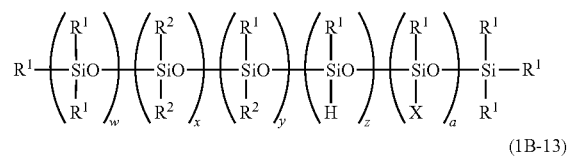

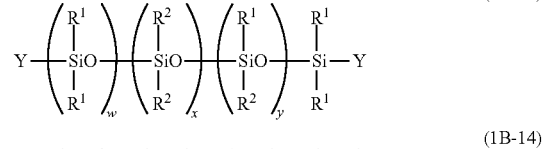

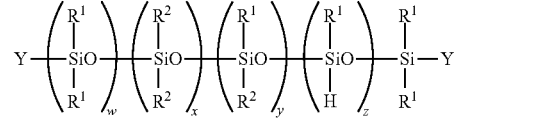

In the nanoparticle-resin composite material according to the embodiment 1A, the combination of the organic compound and the polymer may be any one of 36 combinations ((6×2)×3=36). In the nanoparticle-resin composite material according to the embodiment 1B, the combination of the organic compound and the polymer may be any one of 648 combinations ((6×2)×(3×3×6)=648).

In the nanoparticle-resin composite material according to the second embodiment, the organic compound is at least one selected from the group consisting of carboxylic acids, phosphinic acid, phosphonic acid, sulfinic acid, sulfonic acid, and thiols, the selected compound contains an alkyl group or an olefin chain, and the polymer is dimethyl polysiloxane, methyl hydrogen polysiloxane, or a mixture of dimethyl polysiloxane and methyl hydrogen polysiloxane, parts of the side chains and/or the terminals of the dimethyl polysiloxane and methyl hydrogen polysiloxane being substituted by epoxy groups, carboxyl groups, carbinol groups, methacryl groups, polyether groups, or vinyl groups. The term "olefin chain" means a hydrocarbon group having at least one double bond.

The dimethyl polysiloxane in which the side chains are partially substituted is represented by general formula (2-01)

below; the methyl hydrogen polysiloxane in which the side chains are partially substituted, general formula (2-02) below; the dimethyl polysiloxane in which the termini are substituted, general formula (2-03) below; and the methyl hydrogen polysiloxane in which the terminals are substituted, formula (2-04) below. In the general formula (2-01), $R^1$ represents a monovalent hydrocarbon group other than a phenyl group, X represents an epoxy group, a carboxyl group, a carbinol group, a methacryl group, a polyether group, or a vinyl group, a represents an integer of 1 or more, and b represents an integer of 1 or more. In the general formula (2-02), $R^1$ represents a monovalent hydrocarbon group other than a phenyl group, X represents an epoxy group, a carboxyl group, a carbinol group, a methacryl group, a polyether group, or a vinyl group, a represents an integer of 1 or more, b represents an integer of 1 or more, and c represents an integer of 1 or more. In the general formula (2-03), $R^1$ represents a monovalent hydrocarbon group other than a phenyl group, Y represents an epoxy group, a carboxyl group, a carbinol group, a methacryl group, a polyether group, or a vinyl group, and a represents an integer of 1 or more. In the general formula (2-04), $R^1$ represents a monovalent hydrocarbon group other than a phenyl group, Y represents an epoxy group, a carboxyl group, a carbinol group, a methacryl group, a polyether group, or a vinyl group, a represents an integer of 1 or more, and b represents an integer of 1 or more.

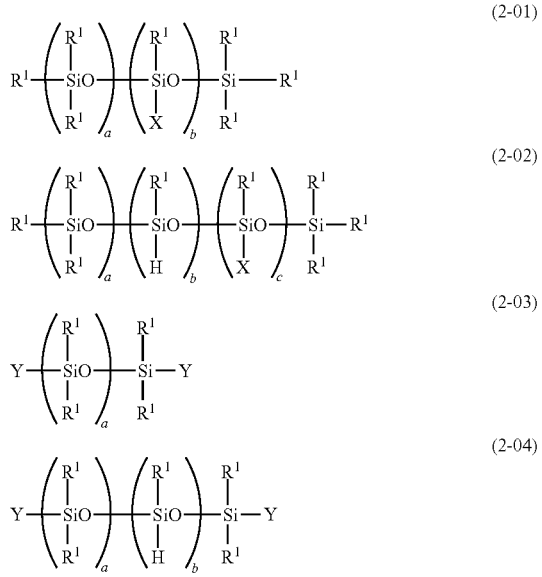

In the nanoparticle-resin composite material according to the second embodiment, the combination of the organic compound and the polymer may be any one of 648 combinations ((6×2)×(3×3×6)=648).

In accordance with a third embodiment of the invention, a nanoparticle-resin composite material has transparency and a refractive index of 1.55 or more in the visible light region and includes inorganic nanoparticles dispersed in a siloxane crosslinked product, wherein the inorganic nanoparticles are coated with an organic compound.

The siloxane-crosslinked product is formed on the basis of crosslinking of a siloxane compound having a siloxane bond (Si—O—Si bond) and a reactive functional group.

The organic compound has a functional group that forms a covalent bond or an ionic bond to the inorganic particle surfaces and an organic group that exhibits affinity for the siloxane compound, and also has a molecular weight of $1\times10^3$ or less.

A method for producing the nanoparticle-resin composite material according to the first or second embodiment includes:

(A) dispersing the inorganic particles and the organic compound in a liquid phase to coat the inorganic particles with the organic compound; and (B) mixing the polymer with the inorganic particles coated with the organic compound.

A method for producing the nanoparticle-resin composite material according to the third embodiment includes:

(A) dispersing the inorganic particles and the organic compound in a liquid phase to coat the inorganic particles with the organic compound;

(B) mixing the siloxane compound with the inorganic particles coated with the organic compound; and (C) crosslinking the siloxane compound by heating to form the siloxane-crosslinked product.

In the method for producing the nanoparticle-resin composite material according to the third embodiment, the step (B) further includes:

(B-1) mixing the inorganic nanoparticles coated with the organic compound with a siloxane compound [1] which has an addition reactive carbon-carbon double bond and which contains a platinum group catalyst to prepare a mixture [1];

(B-2) mixing the inorganic nanoparticles coated with the organic compound with a siloxane compound [2] which has a hydrogen atom bonded to a silicon atom to prepare a mixture [2]; and (B-3) mixing the resultant mixtures [1] and [2].

The step (C) may include heating the resultant mixture of the mixtures [1] and [2].

Alternatively, in the method for producing the nanoparticle-resin composite material according to the third embodiment, the step (B) further includes:

(B-1) mixing the inorganic nanoparticles coated with the organic compound with a siloxane compound [1] which has an addition reactive carbon-carbon double bond to prepare a mixture [1];

(B-2) mixing the inorganic nanoparticles coated with the organic compound with a siloxane compound [2] which has a hydrogen atom bonded to a silicon atom and which contains a platinum group catalyst to prepare a mixture [2]; and (B-3) mixing the resultant mixtures [1] and [2].

The step (C) may include heating the resultant mixture of the mixtures [1] and [2].

A light-emitting device assembly according to the embodiment 1A includes:

(a) a light-emitting device;

(b) a sealing member for sealing the light-emitting device; and (c) a filling material to be filled in the space between the light-emitting device and the sealing member, wherein the filling material is composed of the nanoparticle-resin composite material according to the third embodiment of the invention.

A light-emitting device assembly according to the embodiment 1B includes:

(a) a light-emitting device; and (b) a sealing member for sealing the light-emitting device; and wherein the sealing member is composed of the nanoparticle-resin composite material according to the third embodiment.

A light-emitting device assembly including the nanoparticle-resin composite material according to the first or second embodiment includes the following:

(a) a light-emitting device;
(b) a sealing member for sealing the light-emitting device; and
(c) a filling material to be packed in the space between the light-emitting device and the sealing member, wherein the filling material is composed of the nanoparticle-resin composite material according to the first or second embodiment.

A filling material for a light-emitting device assembly according to another embodiment is composed of the nanoparticle-resin composite material according to the third embodiment.

A filling material for a light-emitting device assembly according to a further embodiment is composed of the nanoparticle-resin composite material according to the first or second embodiment. An optical material may be composed of the nanoparticle-resin composite material according to any one of the first to third embodiments.

The nanoparticle-resin composite materials according to the first to third embodiments may be generically named "the nanoparticle-resin composite material". The light-emitting device assemblies according to the embodiments 1A and 1B and the light-emitting device assembly including the nanoparticle-resin composite material according to the first or second embodiment may be generically named "the light-emitting device assembly". The filling material for a light-emitting device assembly according to another embodiment and the filling material for a light-emitting device assembly including the nanoparticle-resin composite material according to the first or second embodiment may be generically named "the filling material for a light-emitting device assembly of the invention". The optical material including the nanoparticle-resin composite material according to any one of the first to third embodiments may be generically named "the optical material".

The nanoparticle-resin composite materials according to the first and second embodiments including the above-described preferred forms and configurations, the methods for producing the nanoparticle-resin composite materials according to the first and second embodiments, the light-emitting device assemblies including the nanoparticle-resin composite materials according to the first and second embodiments, the filling materials for the light-emitting device assemblies including the nanoparticle-resin composite materials according to the first and second embodiments, and the optical materials including the nanoparticle-resin composite materials according to the first and second embodiment may be generically named "the first embodiment".

The nanoparticle-resin composite material according to the third embodiment including the above-described preferred forms and configurations, the method for producing the nanoparticle-resin composite material according to the third embodiment, the light-emitting device assemblies according to the embodiments 1A and 1B, the filling material for a light-emitting device assembly according to another embodiment, and the optical material including the nanoparticle-resin composite material according to the third embodiment may be generically named "the third embodiment".

According to the embodiments, the inorganic nanoparticles preferably have a refractive index of 1.9 or more in the visible light region. The term "refractive index of the inorganic nanoparticles" specifically means the bulk refractive index of the material constituting the inorganic nanoparticles.

The refractive index of the inorganic particles (more specifically, the bulk refractive index of the material constituting the inorganic nanoparticles), the refractive index of the nanoparticle-resin composite material, the refractive indexes of various materials such as the polymer, the siloxane crosslinked product, and the siloxane compound may be measured with an Abbe refractometer or a V-block refractometer.

In the above-described embodiments, the inorganic nanoparticles are composed of at least one material selected from the group consisting of titanium oxide ($TiO_2$), zirconium oxide ($ZrO_2$), cerium oxide ($CeO_2$), haffiium oxide ($HfO_2$), niobium pentoxide ($Nb_2O_5$), tantalum pentoxide ($Ta_2O_5$), indium oxide ($In_2O_3$), tin oxide ($SnO_2$), ITO (indium tin oxide), zinc oxide (ZnO), and silicon (Si). The inorganic nanoparticles may be composed of one of these materials or a mixture of two or more of these. The inorganic nanoparticles maybe composed of a nitride of any one of these metals.

In the above-described embodiments, the particle diameter (D) of the inorganic nanoparticles is $2\times10^{-9}$ m to $2\times10^{-8}$ m and preferably $2\times10^{-9}$ m to $1.0\times10^{-8}$ m. The particle diameter of the inorganic nanoparticles may be measured by observation with a transmission electron microscope (TEM). When the shape (planar shape) of the inorganic nanoparticles is not circular in observation with a transmission electron microscope, a circle having the same area as that of the observed inorganic nanoparticles is assumed, the diameter of the circle is considered as the particle diameter. When the shape (three-dimensional shape) of the inorganic nanoparticles is not spherical, a rod shape, a spheroidal shape, or a rectangular parallelepiped may be used as an example of the three-dimensional shape of the particles. The particle diameter of the inorganic nanoparticles in the nanoparticle-resin composite material may be measured by, for example, the TEM observation of a slice prepared with a microtome. As described above, the upper limit of the particle diameter (D) of the inorganic nanoparticles is $2\times10^{-8}$ m and preferably $1.0\times10^{-8}$ m. This means the following:

$$D_{ave}+2\sigma \leq 2\times10^{-8} \text{ m or}$$

$$D_{ave}+2\sigma \leq 1.0\times10^{-8} \text{ m}$$

wherein $D_{ave}$ is the average value of the inorganic nanoparticles, and $\sigma$ is the standard deviation. By specifying the particle diameter (D) of the inorganic nanoparticles to $2\times10^{-9}$ m to $2\times10^{-8}$ m, it may be possible to suppress a decrease in light transmittance and light loss due to Rayleigh scattering in the nanoparticle-resin composite material, and to provide the nanoparticle-resin composite material which is actually transparent in the visible region. Since the light transmittance exponentially decreases as the optical path length increases, the smaller inorganic nanoparticles are preferably used for a longer optical path. When the nanoparticles in the nanoparticle-resin composite material aggregate, the aggregates function as effective particles, and thus the inorganic nanoparticles are preferably filled so as to be dispersed without aggregation in order to suppress light scattering.

In accordance with the first embodiment, the polymer constituting the nanoparticle-resin composite material is preferably a liquid (which may be expressed as a starch syrup-like, grease-like, or gel form or may be expressed as being thixotropic). The viscosity of the nanoparticle-resin composite material varies with molecular weight. Therefore, the molecular weight of the polymer may be appropriately determined for controlling the viscosity of the nanoparticle-resin composite material. The molecular weight of the polymer is, for example, $1\times10^2$ to $1\times10^5$. The viscosity of the polymer is, for example, $1\times10^{-2}$ Pa·s to $1\times10$ Pa·s. The viscosity of the nanoparticle-resin composite material is, for example, 1 Pa·s to 20 Pa·s. The sentence "the nanoparticle-resin composite material is a liquid" defines that the material has the property of being flexible and being not plastically deformed.

On the other hand, in accordance with the third embodiment including the above-described forms and configurations, the viscosity of the siloxane compound is, for example, $1 \times 10^{-2}$ Pa·s to $1 \times 10^1$ Pa·s, preferably $1 \times 10^{-2}$ Pa·s to $5 \times 10^0$ Pa·s, and more preferably $1 \times 10^{-2}$ Pa·s to $2.5 \times 10^0$ Pa·s. When the viscosity of the siloxane compound is excessively high, the fluidity of the inorganic nanoparticles may be lost in filling, thereby causing difficulty in sealing a light-emitting device. The number-average molecular weight of the siloxane compound is, for example, $1 \times 10^2$ to $2 \times 10^4$. In accordance with the third embodiment including the above-described forms and configurations, the nanoparticle-resin composite material is a solid or a gel.

The molecular weights of the polymer and the siloxane compound may be measured on the basis of gel permeation chromatography (GPC), and the viscosities of the polymer, the siloxane compound, and the nanoparticle-resin composite material may be measured with, for example, a cone-plate-type rotational viscometer. The molecular weight of the organic compound, which will be described below, is a relative molecular weight measured in terms of polystyrene by gel permeation chromatography.

In accordance with the third embodiment including the above-described forms and configurations, the siloxane compound preferably includes a siloxane compound [1] having an addition reactive carbon-carbon double bond, a siloxane compound [2] having a hydrogen atom bonded to a silicon atom, and a platinum group catalyst. The siloxane compounds [1] and [2] are represented by general formulae (3-11) and (3-21) below. The general formula (3-11) shows a linear siloxane compound containing a linear main chain and a branch, and the general formula (3-21) shows a cyclic diorganopolysiloxane. In these compounds, in addition to the addition reactivie carbon-carbon double bond or the hydrogen atom bonded to a silicon atom, a phenyl group and a monovalent hydrocarbon group other than a phenyl group are present at the side chains or terminals. Furthermore, in the siloxane compounds [1] and [2], parts of the side chains and/or the terminals may be substituted by epoxy groups, carboxyl groups, polyether groups, or carbinol groups. In accordance with the third embodiment, preferably, a mixture [1] of the siloxane compound [1] containing the platinum group catalyst and the inorganic nanoparticles coated with the organic compound and a mixture [2] of the siloxane compound [2] and the inorganic nanoparticles coated with the organic compound are mixed, and the resultant mixture is heated to prepare the siloxane-crosslinked product. Alternatively, preferably, a mixture [1] of the siloxane compound [1] and the inorganic nanoparticles coated with the organic compound and a mixture [2] of the siloxane compound [2] containing the platinum group catalyst and the inorganic nanoparticles coated with the organic compound are mixed, and the resultant mixture is heated to prepare the siloxane-crosslinked product. The siloxane compound [1] and the siloxane compound [2] are separated to permit storage for a long period of time. In other words, a so-called pot life is increased. The inorganic nanoparticles contained in the mixture [1] and the inorganic nanoparticles contained in the mixture [2] may be the same type or different types. In the general formula (3-11), m represents an integer of 1 or more, n, l, p, and q each represent an integer of 0 or more (including 0), and the total of n and l is 1 or more ((n+1)≧1). X represents the addition reactive carbon-carbon double bond (in the siloxane compound [1]) or the hydrogen atom bonded to a silicon atom (in the siloxane compound [2]). However, when p=0, X is essentially present at both terminals. In addition, Y represents an organosiloxane. In the general formula (3-21), m represents an integer of 1 or more, n, l, and q each represent an integer of 0 or more (including 0), the total of n and l is 1 or more ((n+1)≧1), and p represents an integer of 2 or more. X represents the addition reactive carbon-carbon double bond (in the siloxane compound [1]) or the hydrogen atom bonded to a silicon atom (in the siloxane compound [2]), and Y represents an organosiloxane. Linear siloxane compound

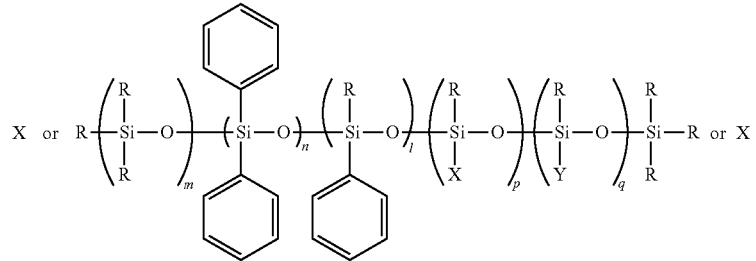

(3-11)

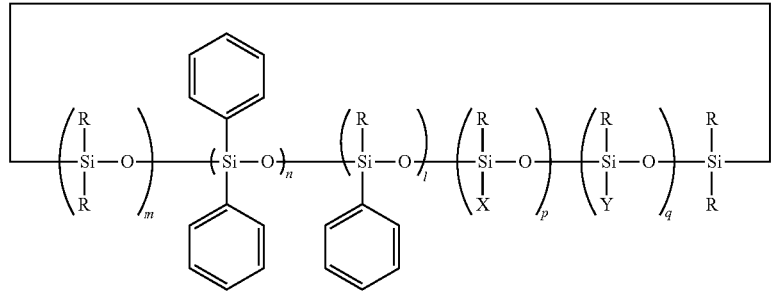

Cyclic siloxane compound (3-21)

The term "addition reactive" means the property of hydrosilylation reaction with the hydrogen atom bonded to a silicon (Si) atom. In the siloxane compound [1] and the siloxane compound [2], the number of the carbon-carbon double bond and the number of the hydrogen atom bonded to a silicon atom are two or more per molecule of the siloxane compound.

In accordance with the third embodiment, examples of a reactive functional group (carbon-carbon double bond) contained in the siloxane compound include a vinyl group, an allyl group, a propenyl group, an isopropenyl group, a butenyl group, a hexenyl group, a cyclohexenyl group, and an octenyl group. The side changes and/or the ends of the siloxane compound are substituted by such reactive functional groups.

Specific examples of the siloxane compound [1] include compounds of structural formulae (3-12), (3-13), (3-14), and (3-15) given below. Specific examples of the siloxane compound [2] include compounds of structural formulae (3-22), (3-23), (3-24), and (3-25) given below.

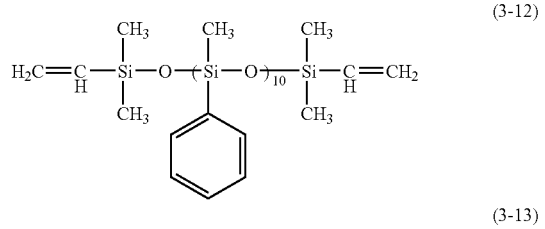
(3-12)

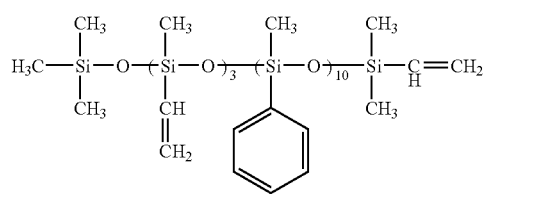
(3-13)

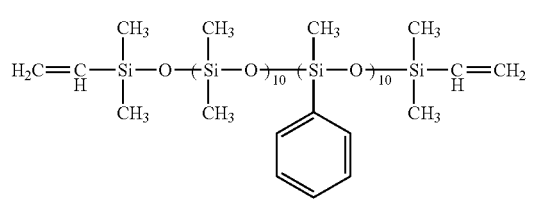
(3-14)

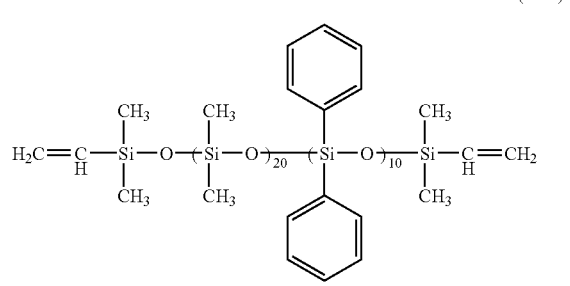
(3-15)

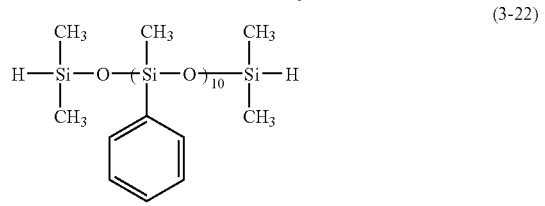
(3-22)

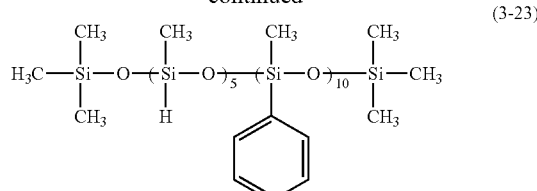
(3-23)

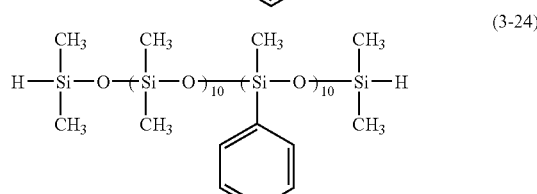
(3-24)

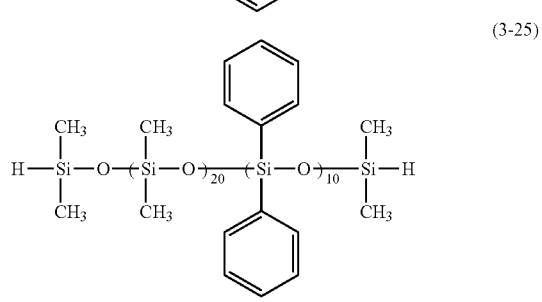
(3-25)

Examples of the platinum group catalyst serving as a curing catalyst include chloroplatinic acid, platinum acetylacetonate, a complex of chloroplatinic acid and octanol, and a vinylsiloxane complex of platinum. The amount by weight of the platinum group catalyst added is preferably in the range of 0.5 ppm to 200 ppm in terms of platinum relative to the total amount of the siloxane compounds. When the amount of the platinum group catalyst added is excessively large, the problem of yellowing, browning, or the like occurs.

In accordance with the third embodiment including the above-descried forms and configurations, the organic compound is at least one compound selected from the group consisting of carboxylic acids, phosphinic acid, phosphonic acid, sulfinic acid, sulfonic acid, and thiols, and the selected compound preferably contains an aryl group, an aryloxy group, an alkyl group, or an olefin chain.

In accordance with any one of the embodiments, at least one compound selected as the organic compound from the group consisting of carboxylic acids, phosphinic acid, phosphonic acid, sulfinic acid, sulfonic acid, and thiols functions as a surfactant or a dispersant. Specific examples of the compound include hexanoic acid, octanoic acid, decanoic acid, dodecanoic acid, hexadecanoic acid, octadecanoic acid (stearic acid), oleic acid, linoleic acid, benzoic acid, acetylbenzoic acid, diphenyl-4-benzoic acid, phenylacetic acid, diphenylacetic acid, methylbenzoic acid, butylbenzoic acid, phenoxyacetic acid, phenoxybenzoic acid, phenylbutyric acid, diphenylphosphinic acid, phenylphosphonic acid, benzenesulfonic acid, dodecylbenzenesulfonic acid, decanethiol, dodecanethiol, and octadecanethiol.

These organic compounds may be used as a mixture of two or more at any desired ratio according to the polymer or siloxane compound used.

In accordance with the embodiments, among the above-described organic compounds, carboxylic acids, phosphinic acid, phosphonic acid, sulfinic acid, and sulfonic acid ionically bond to the surfaces of the inorganic nanoparticles, and thiols covalently bond to the surfaces of the inorganic nanoparticles. Alternatively, in accordance with the embodiments, it may be possible to select an organic compound which has a functional group forming a covalent bond or ionic bond to the surfaces of the inorganic nanoparticles or a functional group forming a coordinate bond or hydrogen bond to the surfaces of the inorganic nanoparticles, and also has affinity for the polymer or the siloxane compound and a molecular weight of $1 \times 10^3$ or less. If the molecular weight of the organic compound exceeds $1 \times 10^3$, the ratio of the organic compound including the polymer or the siloxane-crosslinked product is relatively increased, and the volume filling ratio of the inorganic nanoparticles in the nanoparticle-resin composite material is not sufficiently increased. Consequently, there is the possibility that the refractive index of the nanoparticle-resin composite material is not set to a desired value. The inorganic nanoparticles are satisfactorily dispersed in the nanoparticle-resin composite material by appropriately selecting the organic compound and the siloxane compound constituting the siloxane-crosslinked product.

In accordance with the third embodiment including the above-described forms and configurations, the organic compound is preferably a silane compound containing an aryl group, an aryloxy group, an alkyl group, or an olefin chain. Specific examples of the silane compound include octyltrimethoxysilane, octyldimethylmethoxysilane, octyltriethoxysilane, octylmethyldiethoxysilane, octyltrichlorosilane, dodecyltriethoxysilane, dodecyltrichlorosilane, 7-octenyldimethylchlorosilane, 7-octenyltrimethoxysilane, 4-phenylbutyldimethylchlorosilane, 4-phenylbutyltrichlorosilane, 3-phenoxypropyltrichlrosilane, 3-phenoxypropyldimethylchlorosilane, m-phenoxyphenyldimethylchlorosilane, and styrylethyltrimethoxysilane. The compounds such as 4-phenylbutyldimethylchlorosilane, 4-phenylbutyltrichlorosilane, 3-phenoxypropyltrichlorosilane, 3-phenoxypropyldimethylchlorosilane, m-phenoxyphenyldimethylchlorosilane, and styrylethyltrimethoxysilane have high refractive indexes and are thus preferred for increasing the refractive index of the nanoparticle-resin composite material. These silane compounds may be used as a mixture of two or more at any desired ratio according to the siloxane compound used.

In accordance with the third embodiment, a siloxane compound not having a reactive functional group may be added for controlling the hardness of the resultant nanoparticle-resin composite material. As the siloxane compound not having a reactive functional group, diorganopolysiloxane may be used, and the siloxane compound particularly preferably contains a phenyl group because the refractive index of the nanoparticle-resin composite material is increased. The adding amount of the siloxane compound not having a reactive functional group is preferably 80 parts by weight or less relative to the total of 100 parts by weight of the siloxane compounds [1] and [2]. The molecular weight of the siloxane compound not having a reactive functional group may be selected in a range which does not degrade the fluidity of the nanoparticle-resin composition before crosslinking of the siloxane compound.

In accordance with any one of the embodiments of the invention, the term "visible region" means the wavelength region from 480 nm to 750 nm. Also, the term "transparency", the state in which the inorganic nanoparticles are not aggregated in the polymer or the siloxane-crosslinked product, or the state in which the inorganic nanoparticles are uniformly dispersed in the polymer or the siloxane compound means that the light transmittance is 80% or more in measurement at a wavelength of 400 nm with an optical length of 0.5 mm on the basis of a method for measuring light transmittance, which will be described below.

In accordance with any one of the embodiments of the invention, the nanoparticle-resin composite material may contain known antioxidant and light stabilizer for maintaining heat resistance and light resistance.

In accordance with any one of the embodiments of the invention, the refractive index of the nanoparticle-resin composite material may be controlled on the basis of the following idea: The refractive index of a nanoparticle-resin composite material containing high-refractive-index inorganic nanoparticles which are dispersed in a matrix (polymer or siloxane-crosslinked product) has been theoretically derived by Maxwell Garnet (refer to C. F. Bohren and D. R. Huffinan, "Adsorption and Scattering of Light by Small Particles", John Wiley & Sons, New York, 1983, p. 213). When inorganic nanoparticles are uniformly dispersed in a polymer or a siloxane-crosslinked product, the dielectric constant of the whole nanoparticle-resin composite material is determined from the following equation (1):

$$\varepsilon_{av} = \varepsilon_m \left[ 1 + \frac{3\eta \left( \frac{\varepsilon_p - \varepsilon_m}{\varepsilon_p + 2\varepsilon_m} \right)}{1 - \eta \left( \frac{\varepsilon_p - \varepsilon_m}{\varepsilon_p + 2\varepsilon_m} \right)} \right] \quad (1)$$

wherein $\varepsilon_{av}$: average dielectric constant (dielectric constant of the whole nanoparticle-resin composite material)

$\varepsilon_p$: dielectric constant of spherical particles (inorganic nanoparticles)

$\varepsilon_m$: dielectric constant of matrix (polymer or siloxane-crosslinked product)

$\eta$: volume filling ratio of inorganic nanoparticles

Since refractive index n is expressed by $n = \varepsilon^{1/2}$, the (average) refractive index of the whole nanoparticle-resin composite material is determined using equation (1). For example, when anatase-type titanium oxide nanoparticles having a refractive index of 2.5 are dispersed as inorganic nanoparticles in a siloxane bond-containing polymer or a siloxane-crosslinked product having a refractive index of 1.5, with volume filling ratios $\eta$ of the inorganic nanoparticle of 0.06 and 0.15, the (average) refractive indexes of the whole nanoparticle-resin composite materials are 1.55 and 1.63, respectively. Therefore, the refractive index of the whole nanoparticle-resin composite material may be controlled by changing the volume filling ratio q of the inorganic nanoparticles contained in the nanoparticle-resin composite material. Hence, the constituent material of the inorganic nanoparticles may be previously selected according to the intended refractive index of the nanoparticle-resin composite material, and the volume filling ratio $\eta$ may be determined. The volume filling ratio $\eta$ of the inorganic nanoparticles is determined from the amount of the residue (inorganic nanoparticles and silicon oxide in certain cases) after the organic component of the nanoparticle-resin composite material is burned by heating. A change in weight by heating is measured by, for example, TG measurement. The value of the volume filling ratio of the inorganic nanoparticle in the finally resulting nanoparticle-resin composite material is preferably, for example, 0.01 to 0.4.

When the particle diameter is sufficiently smaller than the wavelength of light, the light transmittance of the nanoparticle-resin composite material on the basis of Rayleigh scat tering may be determined from the following equations (2-1) and (2-2):

$$C_{sca} = \frac{8}{3}\left(\frac{2\pi n_m r}{\lambda}\right)^4 \cdot \left(\frac{\left(\frac{n_p}{n_m}\right)^2 - 1}{\left(\frac{n_p}{n_m}\right)^2 + 2}\right)^2 \cdot \pi r^2 \quad (2\text{-}1)$$

$$\alpha_{sca} = \frac{3}{4}\frac{\eta C_{sca}}{\pi r^3} \quad (2\text{-}2)$$

wherein
$C_{sca}$: scattering sectional area (unit: $nm^2$)
$\alpha_{sca}$: extinction coefficient (unit: $nm^{-1}$)
$n_m$: refractive index of matrix (polymer or siloxane-crosslinked product)
$n_p$: refractive index of spherical particles (inorganic nanoparticles)
r: radius (=$D_{ave}/2$) of spherical particles (inorganic nanoparticles)
η: volume filling ratio of inorganic nanoparticles
λ: wavelength of light in air Therefore, for example, when anatase-type titanium oxide nanoparticles having a refractive index of 2.5 are dispersed as inorganic nanoparticles in a matrix (polymer) or a siloxane-crosslinked product having a refractive index of 1.5, with a volume filling ratio η of 0.15, the particle diameter D of the inorganic nanoparticles is preferably 6 nm or less in order that a light-transmitting portion of the nanoparticle-resin composite material is transparent at the thickness t of 0.5 mm. On the other hand, when zirconium oxide nanoparticles having a refractive index of 2.2 are dispersed as inorganic nanoparticles in a matrix (polymer) or a siloxane-crosslinked product having a refractive index of 1.5, with a volume filling ratio η of 0.15, the particle diameter D of the inorganic nanoparticles is preferably 8 nm or less in order that a light-transmitting portion of the nanoparticle-resin composite material is transparent at the thickness t of 0.5 mm. Hence, the particle diameter D and the filling ratio η of the inorganic nanoparticles are preferably appropriately selected to achieve desired transparency on the basis of the refractive index of the matrix (polymer) or the matrix resin material and the refractive index of the inorganic nanoparticles.

In the method for producing the nanoparticle-resin composite material according to any one of the first to third embodiments of the invention, the surfaces of the inorganic nanoparticles are coated with the organic compound in a liquid phase. Specifically, the inorganic nanoparticles are first developed in an organic solvent, and then the organic compound is added. The organic solvent may be any solvent which dissolves the organic compound. The amount of the organic compound added preferably exceeds the amount sufficient to coat the particle surfaces with one layer of the organic compound. Next, the resultant mixture is processed (dispersion) using a known disperser. As a result, the aggregates of the inorganic nanoparticles are disintegrated. If the inorganic nanoparticles are synthesized in a liquid phase and not dried, each particle is looseaggregated, and thus the aggregates are desirably easily disintegrated. The organic compound adsorbs on the surfaces of the inorganic nanoparticles during processing with the disperser. The temperature of disintegration and adsorption of the organic compound is preferably between room temperature to 80° C. Then, the inorganic nanoparticles coated with the organic compound are recovered as a dispersion liquid in which the inorganic nanoparticles are uniformly dispersed, or precipitates. The recovery form, i.e., the dispersion liquid or the precipitates, depends on the type of the organic solvent used. Alternatively, a poor solvent may be added to the resultant dispersion liquid to re-aggregate the nanoparticles, followed by recovery as precipitates by centrifugal separation. When the nanoparticles are recovered as precipitates, the precipitates may be separated by centrifugal separation, repeatedly washed with a washing organic solvent to remove the excessive organic compound, and then dried under vacuum.

In the method for producing the nanoparticle-resin composite material according to any one of the first to third embodiments of the invention, the inorganic nanoparticles coated with the organic compound may be mixed with the polymer or the siloxane compound by any one of the following two methods: a first method including dispersing the inorganic nanoparticles in a good solvent used in common with the polymer or the siloxane compound, adding the polymer or the siloxane compound to the dispersion, agitating the resultant mixture, and then removing only the organic solvent by heating under vacuum with substantially no evaporation of the polymer or the siloxane compound because of its low vapor pressure; and a second method including mixing a dry powder of the inorganic nanoparticles directly with the polymer or the siloxane compound and the uniformly mixing the mixture with a known kneading machine. In the method for producing the nanoparticle-resin composite material according to the third embodiment of the invention, the siloxane compound is further crosslinked by heating. In this case, the heating atmosphere may be an air atmosphere, and the heating method includes, for example, maintaining at 150° C. for 5 hours using a known oven.

According to the third embodiment, the coefficient of linear expansion of the siloxane-crosslinked product may be measured with a thermomechanical analyzer (TMA). The coefficient of linear expansion of the siloxane-crosslinked product is preferably $1.5 \times 10^{-4}$ or less in the range of 20° C. to 150° C. Therefore, for example, in an operation of a light-emitting device assembly, even when the siloxane-crosslinked product is heated to a high temperature due to the heat generated from the light-emitting device, it may be possible to more securely prevent disconnection of wiring connected to the light-emitting device and to securely prevent the occurrence of a problem in the light-emitting device assembly even at a high temperature.

As the light-emitting device in a light-emitting device assembly according to an embodiment, a light-emitting diode (LED) or a semiconductor laser may be used. Examples of a light-emitting diode used as the light-emitting device include a red light-emitting diode emitting red light (for example, a wavelength of 640 nm), a green light-emitting diode emitting green light (for example, a wavelength of 530 nm), a blue light-emitting diode emitting blue light (for example, a wavelength of 450 mn), and a white light-emitting diode (for example, a white light-emitting diode including a combination of a ultraviolet or blue light-emitting diode and fluorescent particles). The light-emitting diode may have a so-called face-up structure or a flip-chip structure. Namely, the light-emitting diode may have a structure including a substrate and a light-emitting layer formed on the substrate so that light is emitted from the light-emitting layer outward or emitted from the light-emitting layer outward through the substrate. More specifically, the light-emitting diode (LED) has a laminated structure including a first clad layer formed on a substrate and composed of a compound semiconductor with a first conductivity type (for example, n-type), an active layer formed on the first clad layer, and a second clad layer formed on the active layer and composed of a compound semiconductor with a second conductivity type (for example, p-type); a first electrode electrically connected to the first clad layer; and a second electrode electrically connected to the second clad layer. The layers constituting the light-emitting diode may be formed using known compound semiconductor materials depending on the emission wavelengths. In the light-emitting device assembly according to the embodiment of the invention, light emitted from the light-emitting device is emitted outward through a filling material composed of the nanoparticle-resin composite material and a sealing member or emitted outward through a sealing member composed of the nanoparticle-resin composite material.

In the light-emitting device assembly according to the embodiment, the sealing member is preferably composed of a material with a high refractive index from the viewpoint that high reflection at the interface with the filling material is suppressed. Examples of the material with a high refractive index include plastic materials with a high refractive index, such as trade name Prestage (refractive index: 1.74) of Seiko Optical Products Co., Ltd., trade mane, ULTIMAX V AS 1.74 (refractive index: 1.74) of Showa Optronics Co., Ltd., and trade name NL5-AS (refractive index: 1.74) of Nikon Essilor Co., Ltd.; optical glass, such as glass members NBFD11 (refractive index n: 1.78), M-NBFD82 (refractive index n: 1.81), and M-LAF81 (refractive index n: 1.731), which are manufactured by HOYA Corporation; and inorganic dielectric materials, such as $KTiOPO_4$ (refractive index n: 1.78) and lithium niobate $[LiNbO_3]$ (refractive index n: 2.23).

In the light-emitting device assembly according to the embodiment 1A the light-emitting device assembly including the nanoparticle-resin composite material according to the first or second embodiment, examples of the material constituting the sealing member include epoxy resins, silicone resins, acrylic resins, polycarbonate resins, spiro compounds, polymethylmethacrylate and its copolymers, diethylene glycol bis(allylcarbonate) (CR-39), polymers or copolymers of urethane-modified monomers of (brominated) bisphenol A mono(meth)acrylate, polyester resins (e.g., polyethylene terephthalate resins and polyethylene naphthalate resins), unsaturated polyesters, acrylonitrile-styrene copolymers, vinyl chloride resins, polyurethane resins, and polyolefin resins. The sealing material may be composed of at lease one of these materials. In view of heat resistance, an aramid resin may be used. In this case, the upper limit of the heating temperature for forming an antifouling layer composed of a fluorocarbon resin which will be described below is 200° C. or more, and the degree of freedom of selection of a fluorocarbon resin is increased.

The light-emitting device assembly according to the embodiment may be used in any field in which light emission is performed. Examples of such a field include a liquid crystal display backlight (including a planar light source device and divided into the two known types, i.e., a direct-lighting type and an edge light type (also referred to as a "side light type")); lamp fittings and lamps for transport means, such as automobiles, electric railcars, ships, and aircrafts (for example, head lights, tail lights, high-mount stop lights, small lights, turn signal lamps, fog lights, room lamps, meter panel lights, light sources built-in various buttons, destination lamps, emergency lamps, and emergency exit guide lights); lamp fittings and lamps for buildings (outdoor lights, room lamps, lightings, emergency lamps, and emergency exit guide lights); street lights; signals; display lamp fittings for advertising displays, machines, and apparatuses; and lightings and lighting parts in tunnels and underground passages.

In addition to the filling material for the light-emitting device assembly and the light-emitting assembly, examples of applicable fields of the optical material according to an embodiment include the fields of optical lenses and light guides.

The antifouling layer composed of a fluorocarbon resin may be formed on the surface of the sealing member. The thickness of the antifouling layer is not particularly limited, but is $5 \times 10^{-10}$ m to $5 \times 10^{-8}$ m and preferably $1 \times 10^{-9}$ m to $2 \times 10^{-8}$ m in view of the relation to transparency.

The fluorocarbon resin constituting the antifouling layer basically contains a perfluoropolyether group and preferably further contains an alkoxysilano group. The molecular structure other than a perfluoropolyether group is not basically limited, but there is actually a certain limitation based on demand from the viewpoint of ease of synthesis, i.e., realizability. Specifically, the fluorocarbon resin constituting the antifouling layer is exemplified by an alkoxysilane compound having a perfluoropolyether group represented by formula (A) below. In the formula (A), $R_f$ represents a perfluoropolyether group, $R^1$ represents a divalent atom or group, $R^2$ represents an alkylene group, $R^3$ represents an alkyl group, and j is 1 or 2.

Although the molecular weight of the alkoxysilane compound represented by formula (A) is not particularly limited, the number-average molecular weight is $4 \times 10^2$ to $1 \times 10^4$ and preferably $5 \times 10^2$ to $4 \times 10^3$ from the viewpoint of stability and ease of handling.

The perfluoropolyether group $R_f$ is monovalent or divalent. Although specific examples of the structure of the perfluoropolyether group are given below, the structure is not limited to these examples. In structural formulae (B), (C), (D), and (E), p and q are each preferably in the range of 1 to 50, n, l, m, and k each represent an integer of 1 or more, and m/l is preferably in the range of 0.5 to 2.0.

When j=2, for example, the perfluoropolyether group $R_f$ in formula (A) is represented by the following structural formula (B):

When j=1, for example, the perfluoropolyether group $R_f$ in formula (A) is represented by the following structural (C), (D), or (E) in which the hydrogen atoms of all alkyl groups may not be substituted by fluorine atoms, and hydrogen atoms may be partially contained.

Usable examples of the material constituting the antifouling layer containing the perfluoropolyether group include perfluoropolyether terminated with polar groups (refer to Japanese Unexamined Patent Application Publication No. 9-127307), an antifouling film forming composition containing a perfluoropolyether group-containing alkoxysilane compound having a specified structure (refer to Japanese Unexamined Patent Application Publication No. 9-255919), and surface modifiers prepared by combining a perfluoropolyether group-containing alkoxysilane compound with various materials (refer to Japanese Unexamined Patent Application Publication Nos. 9-326240, 10-26701, 10-120442, and 10-148701).

$R^1$ represents a divalent atom or group serving as a bonding group between $R^2$ and the perfluoropolyether group $R_f$. Although $R^1$ is not particularly limited, $R^1$ is preferably an atom other than carbon or atomic group, such as O, NH, or S.

$R^2$ is a hydrocarbon group preferably having 1 to 10 carbon atoms. Specific examples of $R^2$ include alkylene groups such as a methylene group, an ethylene group, and a propylene group; and a phenylene group. $R^3$ is an alkyl group constituting an alkoxy group and usually having 3 or less carbon atoms, for example, an isopropyl group, a propyl group, an ethyl group, or a methyl group. However, the carbon number may be 4 or more.

In order to form the antifouling layer, the fluorocarbon resin (e.g., the alkoxysilane compound represented by formula (A)) is usually dissolved in a solvent. The solvent is not particularly limited, but the solvent is preferably selected in view of the use stability of a composition, wettability of the surface of the sealing member, and volatility. Specific examples of the solvent include alcohol solvents such as ethyl alcohol, ketone solvents such as acetone, and hydrocarbon solvents such as hexane. These solvents may be used alone or as a mixture of two or more.

The solvent used for dissolving the fluorocarbon resin is selected in view of the use stability of a composition, wettability of the surface of the sealing member, and volatility, and for example, a fluorohydrocarbon solvent is used. A fluorohydrocarbon solvent is a compound of a hydrocarbon solvent such as an aliphatic hydrocarbon, a cyclic hydrocarbon, or ether, the hydrogen atoms of which are partially or entirely substituted by fluorine atoms. Examples of such a solvent include trade name ZEORORA-HXE (boiling point: 78° C.) manufactured by Zeon Corporation, perfluoroheptane (boiling point: 80° C.), perfluorooctane (boiling point: 102° C.), hydrofluoropolyethers such as trade name H-GALDEN-ZV75 (boiling point: 75° C.), H-GALDEN-ZV85 (boiling point: 85° C.), H-GALDEN-ZV100 (boiling point: 95° C.), H-GALDEN-C (boiling point: 130° C.), and H-GALDEN-D (boiling point: 178° C.), perfluoropolyethers such as SV-110 (boiling point: 110° C.) and SV-135 (boiling point: 135° C.), which are all manufactured by Ausimont Inc., and perfluoroalkanes such as FE series manufactured by Sumitomo 3M Ltd. Among these fluorohydrocarbon solvents, a solvent having a boiling point in the range of 70° C. to 240° C. is selected as the solvent for dissolving the fluorocarbon compound represented by formula (A), in order to obtain the uniform antifouling layer having a uniform thickness. In particular, hydrofluoropolyethers (HFPE) and hydrofluorocarbons (HFC) are preferably selected alone or as a mixture of two or more. When the boiling point is excessively low, for example, uneven coating tends to occur, while when the boiling point is excessively high, the uniform antifouling layer tends to become difficult to form because of difficulty in drying. HFPE or HFC has excellent solving power for the fluorocarbon compound represented by formula (A), thereby producing an excellent coated surface.

The solution of the fluorocarbon resin (e.g., an alkoxysilane compound represented by formula (A)) in the solvent is applied on the surface of the sealing member and then heated to volatilize the solvent and to bond the material constituting the sealing member and the fluorocarbon resin constituting the antifouling layer, thereby forming the antifouling layer on the surface of the sealing member. As the coating method, any of various methods generally used for coating may be used, but spin coating, spray coating, or the like is preferably used. In view of workability, a coating method of impregnating a material such as paper or a cloth with a liquid may be used. The heating temperature may be selected in view of the heat resistance and the like of the sealing member. For example, when a polyethylene terephthalate resin is used as the sealing member, the heating temperature is properly in the range of 30° C. to 80° C.

The alkoxysilane compound represented by formula (A) exhibits water repellency because it contains a fluorocarbon group in its molecule, thereby improving the fouling resistance. Therefore, when the antifouling layer containing the perfluoropolyether group-containing alkoxysilane compound represented by formula (A) is formed, properties such as abrasion resistance, fouling resistance, and the like are imparted to the surface of the sealing member.

In order to accelerate the reaction between the material constituting the sealing member and the material constituting the antifouling member, at least one material selected from the group consisting of acids, bases, phosphates, and acetylacetone is preferably added as a catalyst to the material constituting the antifouling layer. Specific examples of the catalyst include acids, such as hydrochloric acid; bases, such as ammonia; and phosphates, such as dilauryl phosphate. The amount of the catalyst added is, for example, $1 \times 10^{-3}$ mmol/l to 1 mmol/l. When an acid or base is added, the reactivity is increased by adding a carbonyl compound such as acetylacetone, and thus such a carbonyl compound is preferably added to a composition for forming the antifouling layer. The amount of the carbonyl compound added is preferably about $1 \times 10^{-2}$ mmol/l to $1 \times 10^2$ mmol/l. By adding the catalyst, strong bonding is formed between the sealing member and the antifouling layer even at a lower heating (drying) temperature. As a result, the manufacturing process is made advantageous, and the selection range of the material constituting the sealing material is extended.

In the nanoparticle-resin composite material according to the first embodiment or the method for producing the same, the specified organic compound and polymer are combined, the surfaces of the inorganic nanoparticles are coated with the specified organic compound, and the specified polymer is used. Therefore, it may be possible to uniformly disperse the inorganic nanoparticles in the polymer having siloxane bonds without aggregation, and to provide the nanoparticle-resin composite material having transparency, a high refractive index, and high light transmittance. When the specified compound and polymer are not combined, the inorganic nanoparticles aggregate in the polymer having siloxane bonds to fail to uniformly disperse the nanoparticles, thereby significantly decreasing the light transmittance of the nanoparticle-resin composite material.

In accordance with the third embodiment, the surfaces of the inorganic nanoparticles are coated with the predetermined organic compound. Therefore, it may be possible to uniformly disperse the inorganic nanoparticles in a siloxane compound without aggregation, and to provide the nanoparticle-resin composite material having transparency, a high refractive index, high light transmittance, and a small coefficient of linear expansion even at high temperatures.

In accordance with any one of the embodiments, the refractive index of the nanoparticle-resin composite material is controlled on the basis of the type and volume filling ratio of the inorganic particles, and a refractive index of 1.55 or more is achieved in the visible region. In the light-emitting device assembly according to an embodiment of the invention, when the nanoparticle-resin composite material having transparency, a high refractive index, high light transmittance, and a small coefficient of linear expansion even at high temperatures is used as the filing material (sealing material), it may be possible to provide the light-emitting device assembly having a high efficiency of light emission and excellent light resistance and durability.

In accordance with the first embodiment, it may be possible to provide the light-emitting device assembly having a high efficiency of light emission and excellent light resistance and durability, and causing no disconnection of wiring connected to the light-emitting device even when the nanoparticle-resin composite material is heated to a high temperature. In accordance with the third embodiment, the siloxane compound is crosslinked, and thus the nanoparticle-resin composite material is a solid or gel. Therefore, in an operation of the light-emitting device assembly according to the embodiment of the invention, even when the nanoparticle-resin composite material is heated to a high temperature due to the heat generated from the light-emitting device, it may be possible to prevent the phenomenon that the fluidity of the nanoparticle-resin composite material is increased to flow out the material from the light-emitting device assembly, thereby securing the long-term reliability of the light-emitting device assembly.

DETAILED DESCRIPTION

Figure 1:
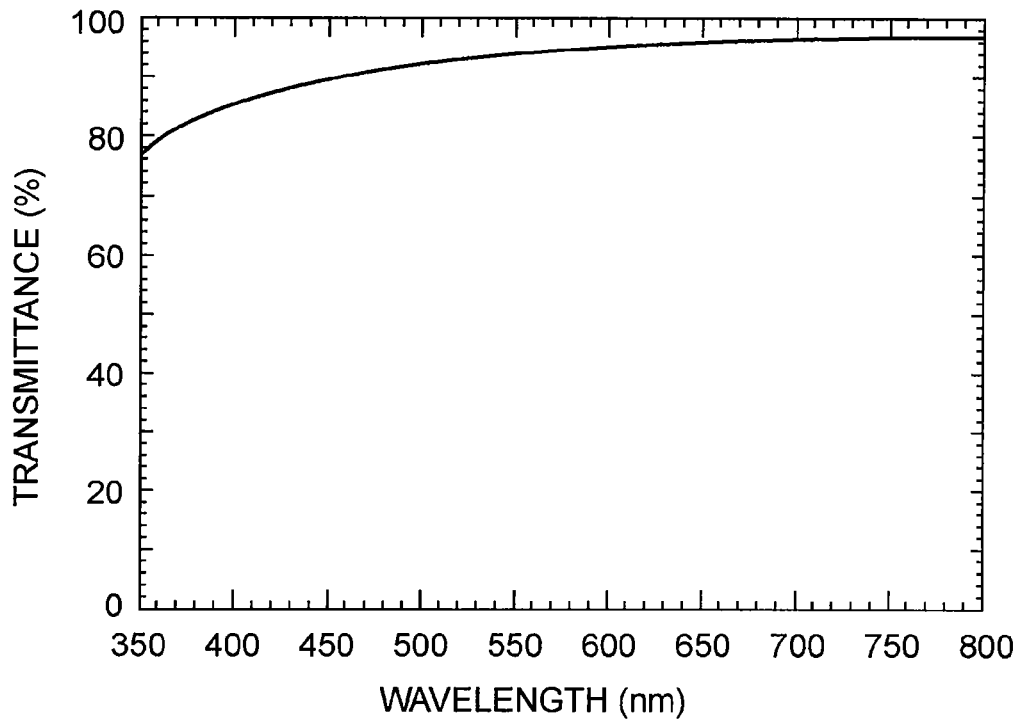
FIG. 1 is a graph showing the results of measurement of the light transmittance of a nanoparticle-resin composite material with a UV-visible spectrophotometer in Example 1.

The present invention will be described on the basis of examples with reference to the drawings. However, the present invention is not limited to these examples.

EXAMPLE 1

Example 1 relates to a nanoparticle-resin composite material according to the embodiment 1A and a method for producing the same. The nanoparticle-resin composite material of each of Example 1 and Examples 2 to 9 which will be described below has transparency and a refractive index of 1.55 or more in the visible region and contains inorganic nanoparticles dispersed in a siloxane bond-containing polymer, the inorganic nanoparticles being coated with an organic compound. In Example 1, as the organic compound, at least one compound is selected from the group consisting of carboxylic acids, phosphinic acid, phosphonic acid, sulfinic acid, sulfonic acid, and thiols, and the selected compound contains an aryl group or aryloxy group. On the other hand, the polymer is methylphenyl polysiloxane, methylphenyl hydrogen polysiloxane, or a mixture of methylphenyl polysiloxane and methylphenyl hydrogen polysiloxane. The method for producing the nanoparticle-resin composite material of each of Example 1 and Examples 2 to 9 which will be described below includes:

(A) dispersing the inorganic nanoparticles and the organic compound in a liquid phase to coat the inorganic nanoparticles with the organic compound; and (B) the polymer and the inorganic nanoparticles coated with the organic compound.

The method for producing the nanoparticle-resin composite material of Example 1 will be described below. More specifically, in Example 1, the organic compound was an aryl group-containing carboxylic acid, 4-phenylbutyric acid, and the polymer was methylphenyl polysiloxane represented by the chemical formula (101) below.

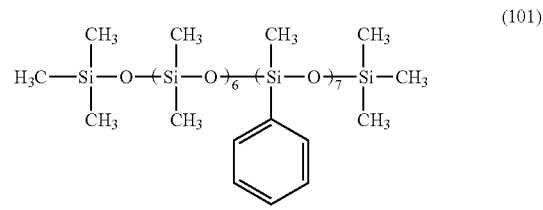

First, 1 g of $ZrO_2$ nanoparticles having a particle diameter of 8 nm and synthesized by a sol-gel method was mixed in 20 ml of an organic solvent mixture containing MEK and ethanol (volume ratio 2/1), and then 1 g of 4-phenylbutyric acid was added to the resultant mixture, followed by dispersion by stirring with a disper at room temperature. In this operation, 4-phenylbutyric acid formed ionic bonds to the surfaces of the $ZrO_2$ nanoparticles. Next, 30 ml of ethanol was added to the resultant dispersion, and precipitates were collected by centrifugal separation. Then, 50 ml of ethanol was added to the precipitates, and the precipitates were disintegrated with a disper. Then, the inorganic nanoparticles were again precipitated by centrifugal separation and collected as precipitates. The operation of washing and centrifugal separation was repeated three times, and then the precipitates were recovered and dried under vacuum to obtain $ZrO_2$ nanoparticles with the surfaces coated with 4-phenylbutyric acid. In the description below, the expression that the particle diameter of the inorganic nanoparticles is D nm means that the value of $(D_{ave} + 2\sigma)$ does not exceed D nm, wherein $D_{ave}$ is the average particle diameter of the inorganic nanoparticles and $\sigma$ is the standard deviation.

Next, a predetermined amount of the $ZrO_2$ nanoparticles was added to toluene and dispersed in toluene with a disper, and methylphenyl polysiloxane (nD=1.55, viscosity=43 mPa·s) used as the polymer was added to the resultant dispersion so that the volume filling ratio of the $ZrO_2$ nanoparticles was 14%, followed by uniform mixing using a defoaming stirrer. Then, toluene was removed from the resultant mixture with an evaporator (temperature set at 40° C.) to obtain a nanoparticle-resin composite material including the $ZrO_2$ nanoparticles dispersed as the inorganic nanoparticles in methylphenyl polysiloxane used as the polymer, the surfaces of the nanoparticles being coated with 4-phenylbutyric acid used as the organic compound. The resultant nanoparticle-resin composite material was liquid (specifically, a starch syrup-like state).

The refractive index of the nanoparticle-resin composite material was measured with a known Abbe refractometer (manufactured by ATAGO Co., Ltd.; Model No. NAR-4T) at the D-line wavelength. The light transmittance of the nanoparticle-resin composite material was measured with a UV-visible spectrophotometer (manufactured by Hitachi High-Technologies Corporation; Model No. U-3410) using a quartz cell having an optical length of 0.5 mm in the measurement wavelength range from 380 nm to 750 nm.

The refractive index of the nanoparticle-resin composite material measured at the D-line wavelength was 1.63. As seen from FIG. 1, the light transmittance of the nanoparticle-resin composite material was 80% or more.

In the examples described below, the refractive index was measured at the D-line wavelength, and the light transmittance was measured using a quartz cell having an optical length of 0.5 mm in the visible wavelength region from 380 nm to 750 nm.

As modifications of Example 1, Examples 1-A to 1-F which will be described below were performed. The organic compounds used in Examples 1-A to 1-F were as shown below. The polymer used in each of these examples was the same as in Example 1. In Examples 1-B, 1-E, and 1-F, $ZrO_2$ nanoparticles having a particle diameter of 5 nm and synthesized by a sol-gel method were used as the inorganic nanoparticles. The reflective indexes, light transmittance, and states of the resultant nanoparticle-resin composite materials are shown in Table 1.

[Organic Compound]

Example 1: an aryl group-containing carboxylic acid, 4-phenylbutyric acid, denoted by symbol "1" in the column of "Organic compound" in Table 1.

Example 1-A: an aryloxy group-containing carboxylic acid, 4-phenoxybenzoic acid, denoted by symbol "1-A" in the column of "Organic compound" in Table 1.

Example 1-B: 4-phenylbutyric acid (symbol "1").

Example 1-C: an aryl group-containing carboxylic acid, 2-naphthoic acid, denoted by symbol "1-C" in the column of "Organic compound" in Table 1.

Example 1-D: an aryl group-containing carboxylic acid, 1-naphthoic acid, denoted by symbol "1-D" in the column of "Organic compound" in Table 1.

Example 1-E: an aryl group-containing carboxylic acid, 2-naphthoic acid (symbol "1-C").

Example 1-F: an aryl group-containing carboxylic acid, 1-naphthoic acid (symbol "1-D").

EXAMPLE 2

Example 2 is a modification of Example 1. In Example 2, a nanoparticle-resin composite material was produced by the same method as in Example 1 and Examples 1-A to 1-F except that methylphenyl hydrogen polysiloxane represented by the chemical formula (201) below was used as the polymer. The refractive index, light transmittance, and state of the resultant nanoparticle-resin composite material were substantially the same as in Example 1 and Examples 1-A to 1-F.

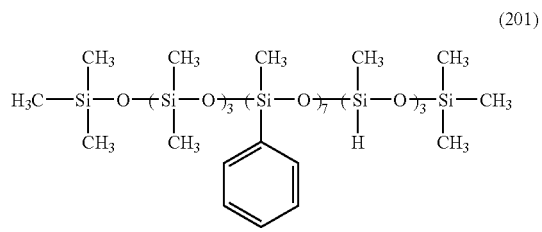

(201)

EXAMPLE 3

Example 3 is a modification of Example 1. In Example 3, a nanoparticle-resin composite material was produced by the same method as in Example 1 and Examples 1-A to 1-F except that a mixture of methylphenyl polysiloxane represented by the chemical formula (101) and methylphenyl hydrogen polysiloxane represented by the chemical formula

TABLE 1

| | Example | | | | | | |
|---|---|---|---|---|---|---|---|
| | 1 | 1-A | 1-B | 1-C | 1-D | 1-E | 1-F |
| Nanoparticles | | | | | | | |
| Composition | $ZrO_2$ | $ZrO_2$ | $ZrO_2$ | $ZrO_2$ | $ZrO_2$ | $ZrO_2$ | $ZrO_2$ |
| Average particle diameter | 8 | 8 | 5 | 8 | 8 | 5 | 5 |
| Refractive index | 2.2 | 2.2 | 2.2 | 2.2 | 2.2 | 2.2 | 2.2 |
| Organic compound | | | | | | | |
| Composition | 1 | 1-A | 1 | 1-C | 1-D | 1-C | 1-D |
| Molecular weight | 164 | 214 | 164 | 172 | 172 | 172 | 172 |
| Polymer | | | | | | | |
| Composition | Methylphenyl polysiloxane | Methylphenyl polysiloxane | Methylphenyl polysiloxane | Methylphenyl polysiloxane | Methylphenyl polysiloxane | Methylphenyl polysiloxane | Methylphenyl polysiloxane |
| Molecular weight | 1138 | 1138 | 1138 | 1138 | 1138 | 1138 | 1138 |
| Refractive index | 1.55 | 1.55 | 1.55 | 1.55 | 1.55 | 1.55 | 1.55 |
| Viscosity (mPa·s) | 43 | 43 | 43 | 43 | 43 | 43 | 43 |
| Nanoparticle-resin composite material | | | | | | | |
| Refractive index | 1.63 | 1.62 | 1.63 | 1.63 | 1.63 | 1.63 | 1.63 |
| Transmittance (% or more) | 80 | 80 | 90 | 80 | 80 | 90 | 90 |
| Viscosity (mPa·s) | 10 | 10 | 10 | 10 | 10 | 10 | 10 |
| Volume filling ratio (%) | 14 | 14 | 14 | 14 | 14 | 14 | 14 |
| State | Liquid | Liquid | Liquid | Liquid | Liquid | Liquid | Liquid |

(Note) Organic compound composition:
Composition 1: 4-phenylbutyric acid
Composition 1-A: 4-phenoxybenzoic acid
Composition 1-C: 2-naphthoic acid
Composition 1-D: 1-naphthoic acid (201) was used as the polymer. The refractive index, light transmittance, and state of the resultant nanoparticle-resin composite material were substantially the same as in Example 1 and Examples 1-A to 1-F.

EXAMPLE 4

Example 4 relates to a nanoparticle-resin composite material according to the embodiment 1B of the invention and a method for producing the same. In Example 4, as the organic compound, at least one compound was selected from the group consisting of carboxylic acids, phosphinic acid, phosphonic acid, sulfinic acid, sulfonic acid, and thiols, and the selected compound contained an aryl group or aryloxy group. On the other hand, the polymer was methylphenyl polysiloxane, methylphenyl hydrogen polysiloxane, or a mixture of methylphenyl polysiloxane and methylphenyl hydrogen polysiloxane, parts of the side chains and/or the terminals of methylphenyl polysiloxane and methylphenyl hydrogen polysiloxane being substituted by epoxy groups, carboxyl group, carbinol groups, methacryl groups, polyether groups, or vinyl groups.

The nanoparticle-resin composite material and the method for producing the same of Example 4 will be described in detail below. More specifically, in Example 4, the organic compound was a carboxylic acid, and the polymer is methylphenyl polysiloxane represented by chemical formula (401) below in which the side chain methyl groups bonded to Si atoms are partially substituted by polyether groups.

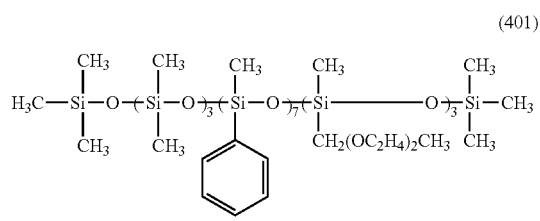

(401)

First, 1 g of $ZrO_2$ nanoparticles having a particle diameter of 5 m-n and synthesized by a sol-gel method was mixed in 20 ml of an organic solvent mixture containing MEK and ethanol (volume ratio 2/1), and then 1 ml of 4-phenylbutyric acid was added to the resultant mixture, followed by stirring with a disper at room temperature. Next, 30 ml of ethanol was added to the resultant dispersion, and precipitates were collected by centrifugal separation. Then, 50 ml of ethanol was added to the precipitates, the precipitates were disintegrated with a disper, and the inorganic nanoparticles were again precipitated by centrifugal separation and collected as precipitates. The operation of washing and centrifugal separation was repeated three times, and then the precipitates were recovered and dried under vacuum to obtain $ZrO_2$ nanoparticles with the surfaces coated with 4-phenylbutyric acid.

Next, a predetermined amount of the $ZrO_2$ nanoparticles was added to toluene and dispersed in toluene with a disper, and polyether-modified methylphenyl polysiloxane ($n_D$=1.51, viscosity=500 mPa·s) used as the polymer was added to the resultant dispersion so that the volume filling ratio of the $ZrO_2$ nanoparticles was 14%, followed by uniform mixing using a defoaming stirrer. Then, toluene was removed from the resultant mixture with an evaporator (set temperature 40° C.) to obtain a nanoparticle-resin composite material including the $ZrO_2$ nanoparticles dispersed as the inorganic nanoparticles in polyether-modified methylphenyl polysiloxane used as the polymer, the surfaces of the nanoparticles being coated with oleic acid used as the organic compound.

The refractive index of the nanoparticle-resin composite material was 1.58, and the light transmittance of the nanoparticle-resin composite material was 80% or more in the visible region. In addition, the nanoparticle-resin composite material was liquid (more specifically, a starch syrup-like state).

As modifications of Example 4, Examples 4-A to 4-F which will be described below were performed. The organic compounds used in Examples 4-A to 4-F were as shown below. The polymer used in each of these examples was the same as in Example 4. In Examples 4-B, 4-E, and 4-F, $ZrO_2$ nanoparticles having a particle diameter of 5 nm and synthesized by a sol-gel method were used as the inorganic nanoparticles. The reflective indexes, light transmittance, and states of the resultant nanoparticle-resin composite materials are shown in Table 2.

[Organic Compound]

Example 4: an aryl group-containing carboxylic acid, 4-phenylbutyric acid, denoted by symbol "4" in the column of "Organic compound" in Table 2.

Example 4-A: an aryloxy group-containing carboxylic acid, 4-phenoxybenzoic acid, denoted by symbol "4-A" in the column of "Organic compound" in Table 2.

Example 4-B: 4-phenylbutyric acid (symbol "4").

Example 4-C: an aryl group-containing carboxylic acid, 2-naphthoic acid, denoted by symbol "4-C" in the column of "Organic compound" in Table 2.

Example 4-D: an aryl group-containing carboxylic acid, 1-naphthoic acid, denoted by symbol "4-D" in the column of "Organic compound" in Table 2.

Example 4-E: an aryl group-containing carboxylic acid, 2-naphthoic acid (symbol "4-C").

Example 4-F: an aryl group-containing carboxylic acid, 1-naphthoic acid (symbol "4-D").

TABLE 2

| | Example | | | | | | |
|---|---|---|---|---|---|---|---|
| | 4 | 4-A | 4-B | 4-C | 4-D | 4-E | 4-F |
| | Nanoparticles | | | | | | |
| Composition | $ZrO_2$ | $ZrO_2$ | $ZrO_2$ | $ZrO_2$ | $ZrO_2$ | $ZrO_2$ | $ZrO_2$ |
| Average particle diameter (nm) | 8 | 8 | 5 | 8 | 8 | 5 | 5 |
| Refractive index | 2.2 | 2.2 | 2.2 | 2.2 | 2.2 | 2.2 | 2.2 |
| | Organic compound | | | | | | |
| Composition | 4 | 4-A | 4 | 4-C | 4-D | 4-C | 4-D |
| Molecular weight | 164 | 214 | 164 | 172 | 172 | 172 | 172 |

TABLE 2-continued

| | \multicolumn{7}{c}{Example} | | | | | | |
|---|---|---|---|---|---|---|---|
| | 4 | 4-A | 4-B | 4-C | 4-D | 4-E | 4-F |
| | \multicolumn{7}{c}{Polymer} | | | | | | |
| Composition | Polyether-modified Methylphenyl polysiloxane | Polyether-modified Methylphenyl polysiloxane | Polyether-modified Methylphenyl polysiloxane | Polyether-modified Methylphenyl polysiloxane | Polyether-modified Methylphenyl polysiloxane | Polyether-modified Methylphenyl polysiloxane | Polyether-modified Methylphenyl polysiloxane |
| Molecular weight | 1864 | 1864 | 1864 | 1864 | 1864 | 1864 | 1864 |
| Refractive index | 1.51 | 1.51 | 1.51 | 1.51 | 1.51 | 1.51 | 1.51 |
| Viscosity (mPa·s) | 500 | 500 | 500 | 500 | 500 | 500 | 500 |
| | \multicolumn{7}{c}{Nanoparticle-resin composite material} | | | | | | |
| Refractive index | 1.58 | 1.58 | 1.58 | 1.60 | 1.60 | 1.60 | 1.60 |
| Transmittance (% or more) | 80 | 80 | 90 | 80 | 80 | 90 | 90 |
| Viscosity (mPa·s) | 10 | 10 | 10 | 10 | 10 | 10 | 10 |
| Volume filling ratio (%) | 10 | 10 | 10 | 10 | 10 | 10 | 10 |
| State | Liquid | Liquid | Liquid | Liquid | Liquid | Liquid | Liquid |

(Note) Organic compound composition:
Composition 4: 4-phenylbutyric acid
Composition 4-A: 4-phenoxybenzoic acid
Composition 4-C: 2-naphthoic acid
Composition 4-D: 1-naphthoic acid

EXAMPLE 5

Example 5 is a modification of Example 4. In Example 5, a nanoparticle-resin composite material was produced by the same method as in Example 4 and Examples 4-A to 4-F except that methylphenyl hydrogen polysiloxane represented by the chemical formula (501) below, in which the side chain methyl groups bonded to Si atoms are partially substituted by polyether groups, was used as the polymer. The refractive index, light transmittance, and state of the resultant nanoparticle-resin composite material were substantially the same as in Example 4 and Examples 4-A to 4-F.

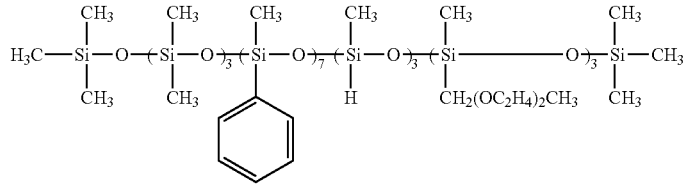

(501)

EXAMPLE 6

Example 6 is a modification of Example 4. In Example 6, a nanoparticle-resin composite material was produced by the same method as in Example 4 and Examples 4-A to 4-F except that a mixture of methylphenyl polysiloxane represented by chemical formula (401), in which the side chain methyl groups bonded to Si atoms are partially substituted by polyether groups, and methylphenyl hydrogen polysiloxane represented by chemical formula (501), in which the side chain methyl groups bonded to Si atoms are partially substituted by polyether groups, was used as the polymer. The refractive index, light transmittance, and state of the resultant nanoparticle-resin composite material were substantially the same as in Example 4 and Examples 4-A to 4-F.

EXAMPLE 7

Example 7 relates to a nanoparticle-resin composite material according to the second embodiment of the invention and a method for producing the same. In the nanoparticle-resin composite material of Example 7, the organic compound was at least one compound selected from the group consisting of carboxylic acids, phosphinic acid, phosphonic acid, sulfinic acid, sulfonic acid, and thiols, and the selected compound contained an alkyl group or olefin chain. On the other hand, the polymer was dimethyl polysiloxane, methyl hydrogen polysiloxane, or a mixture of dimethyl polysiloxane and methyl hydrogen polysiloxane, parts of the side chains and/or the terminals of dimethyl polysiloxane and methyl hydrogen polysiloxane being substituted by epoxy groups, carboxyl group, carbinol groups, methacryl groups, polyether groups, or vinyl groups.

The nanoparticle-resin composite material and the method for producing the same of Example 7 will be described in detail below. More specifically, in Example 7, the organic compound was an olefin chain-containing carboxylic acid, oleic acid, and the polymer was polyether-modified dimethyl polysiloxane represented by the chemical formula (701) below in which the methyl group side chains bonded to Si atoms are partially substituted by polyether groups.

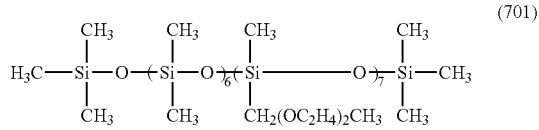

(701)

First, 1 g of $ZrO_2$ nanoparticles having a particle diameter of 8 nm and synthesized by a sol-gel method was mixed in 10 ml of toluene, and then 1 ml of oleic acid was added to the resultant mixture, followed by stirring with a disper at room temperature. Next, 40 ml of ethanol was added to the resultant dispersion, and precipitates were collected by centrifugal separation. Then, 10 ml of toluene was added to the precipitates, and the precipitates were dispersed with a disper. Then, 40 ml of ethanol was added to the resultant dispersion, and the inorganic nanoparticles were again precipitated by centrifugal separation and collected as precipitates. The operation of washing and centrifugal separation was repeated three times, and then the precipitates were recovered and dried under vacuum to obtain $ZrO_2$ nanoparticles with the surfaces coated with oleic acid.

Next, a predetermined amount of the $ZrO_2$ nanoparticles was added to toluene and dispersed in toluene with a disper, and polyether-modified dimethyl polysiloxane ($n_D$=1.45, viscosity=144 mPa·s) used as the polymer was added to the resultant dispersion so that the volume filling ratio of the $ZrO_2$ nanoparticles was 18%, followed by uniform mixing using a defoaming stirrer. Then, toluene was removed from the resultant mixture with an evaporator (set temperature 40° C.) to obtain a nanoparticle-resin composite material including the $ZrO_2$ nanoparticles dispersed as the inorganic nanoparticles in polyether-modified dimethyl polysiloxane used as the polymer, the surfaces of the nanoparticles being coated with oleic acid used as the organic compound.

The refractive index of the nanoparticle-resin composite material was 1.57, and the light transmittance of the nanoparticle-resin composite material was 80% or more. In addition, the nanoparticle-resin composite material was liquid (more specifically, a starch syrup-like state).

As modifications of Example 7, Examples 7-A to 7-D which will be described below were performed. The organic compounds used in Examples 7-A to 7-D were as shown below. The polymer used in each of these examples was the same as in Example 7. In Examples 7-B and 7-D, $ZrO_2$ nanoparticles having a particle diameter of 5 nm and synthesized by a sol-gel method were used as the inorganic nanoparticles. The reflective indexes, light transmittance, and states of the resultant nanoparticle-resin composite materials are shown in Table 3.

[Organic Compound]

Example 7: an olefin chain-containing carboxylic acid, oleic acid, denoted by symbol "7" in the column of "Organic compound" in Table 3.

Example 7-A: an alkyl chain-containing carboxylic acid, stearic acid, denoted by symbol "7-A" in the column of "Organic compound" in Table 3.

Example 7-B: oleic acid (symbol "7").

Example 7-C: an alkyl group-containing carboxylic acid, dodecanoic acid, denoted by symbol "7-C" in the column of "Organic compound" in Table 3.

Example 7-D: dodecanoic acid (symbol "7-C").

TABLE 3

| | Example | | | | |
|---|---|---|---|---|---|
| | 7 | 7-A | 7-B | 7-C | 7-D |
| Nanoparticles | | | | | |
| Composition | $ZrO_2$ | $ZrO_2$ | $ZrO_2$ | $ZrO_2$ | $ZrO_2$ |
| Average particle diameter (nm) | 8 | 8 | 5 | 8 | 5 |
| Refractive index | 2.2 | 2.2 | 2.2 | 2.2 | 2.2 |
| Organic compound | | | | | |
| Composition | 7 | 7-A | 7 | 7-C | 7-D |
| Molecular weight | 282 | 285 | 282 | 230 | 230 |
| Polymer | | | | | |
| Composition | Polyether-modified dimethyl polysiloxane | Polyether-modified dimethyl polysiloxane | Polyether-modified dimethyl polysiloxane | Polyether-modified dimethyl polysiloxane | Polyether-modified dimethyl polysiloxane |
| Molecular weight | 1726 | 1726 | 1726 | 1726 | 1726 |
| Refractive index | 1.45 | 1.45 | 1.45 | 1.45 | 1.45 |
| Viscosity (mPa·s) | 144 | 144 | 144 | 144 | 144 |
| Nanoparticle-resin composite material | | | | | |
| Refractive index | 1.57 | 1.57 | 1.57 | 1.58 | 1.58 |
| Transmittance (% or more) | 80 | 80 | 90 | 80 | 90 |
| Viscosity (mPa·s) | 10 | 10 | 10 | 10 | 10 |
| Volume filling ratio (%) | 20 | 20 | 20 | 20 | 20 |
| State | Liquid | Liquid | Liquid | Liquid | Liquid |

(Note) Organic compound composition:
Composition 7: oleic acid
Composition 7-A: stearic acid
Composition 7-C: dodecanoic acid

EXAMPLE 8

Example 8 is a modification of Example 7. In Example 8, a nanoparticle-resin composite material was produced by the same method as in Example 7 and Examples 7-A to 7-D except that methyl hydrogen polysiloxane represented by the chemical formula (801) below, in which the side chain methyl groups bonded to Si atoms are partially substituted by polyether groups, was used as the polymer. The refractive index, light transmittance, and state of the resultant nanoparticle-resin composite material were substantially the same as in Example 7 and Examples 7-A to 7-D.

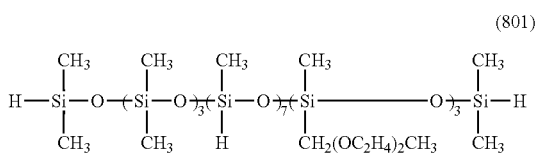
(801)

EXAMPLE 9

Example 9 is a modification of Example 7. In Example 9, a nanoparticle-resin composite material was produced by the same method as in Example 7 and Examples 7-A to 7-D except that a mixture of polyether-modified dimethyl polysiloxane represented by chemical formula (701), in which the side chain methyl groups bonded to Si atoms are partially substituted by polyether groups, and methyl hydrogen polysiloxane represented by chemical formula (801), in which the side chain methyl groups bonded to Si atoms are partially substituted by polyether groups, was used as the polymer. The refractive index, light transmittance, and state of the resultant nanoparticle-resin composite material were substantially the same as in Example 7 and Examples 7-A to 7-D.

COMPARATIVE EXAMPLE 1

In Comparative Example 1, a nanoparticle-resin composite material was produced by processing under the same conditions as in Example 1 except that dimethyl polysiloxane ($n_D$=1.4, viscosity=107 mPa·s) was used as the siloxane bond-containing polymer. Since an aryl group-containing carboxylic acid, 4-phenylbutyric acid, was used as the organic compound, methylphenyl polysiloxane, methylphenyl hydrogen polysiloxane, or a mixture of methylphenyl polysiloxane and methylphenyl hydrogen polysiloxane was suitable as the polymer. However, in Comparative Example 1, dimethyl polysiloxane was used, and thus the combination of the organic compound and the polymer was unsuitable.

In the resultant nanoparticle-resin composite material, the $ZrO_2$ nanoparticles significantly aggregated, the transmittance was 1% or less over the entire visible region, and the refractive index could not be measured.

EXAMPLE 10

Example 10 relates to a nanoparticle-resin composite material according to the third embodiment and a method for producing the same. The nanoparticle-resin composite material of Example 10 or Example 11, which will be described below, includes inorganic nanoparticles dispersed in a siloxane-crosslinked product and coated with an organic compound, and has transparency and a refractive index of 1.55 or more in the visible light region. The siloxane-crosslinked product is formed on the basis of crosslinking of a siloxane compound having a siloxane bond and a reactive functional group. The organic compound has a functional group that forms a covalent or ionic bond to the surfaces of the inorganic nanoparticles and an organic group exhibiting affinity for the siloxane compound and also has a molecular weight of $1 \times 10^3$ or less. The method for producing the nanoparticle-resin composite material of Example 10 or Example 11 which will be described below is a method for producing the nanoparticle-resin composite material having transparency and a refractive index of 1.55 or more in the visible region and including the inorganic nanoparticles in the siloxane-crosslinked product and coated with the organic compound, wherein the siloxane-crosslinked product is formed on the basis of crosslinking of a siloxane compound having a siloxane bond and a reactive functional group, and the organic compound has a functional group that forms a covalent or ionic bond to the surfaces of the inorganic nanoparticles and an organic group exhibiting affinity for the siloxane compound and also has a molecular weight of $1 \times 10^3$ or less. The method includes:

(A) dispersing the inorganic nanoparticles and the organic compound in a liquid phase to coat the inorganic nanoparticles with the organic compound;

(B) mixing the siloxane compound with the inorganic nanoparticles coated with the organic compound; and (C) crosslinking the siloxane compound by heating to form the siloxane-crosslinked product.

The method for producing the nanoparticle-resin composite material of Example 10 will be described in detail below. More specifically, in Example 10, an aryloxy group-containing carboxylic acid, 4-phenoxybenzoic acid, was used as the organic compound, methylphenyl siloxane having addition reactive carbon-carbon double bonds at both ends, to which a vinyl siloxane complex of Pt was added as a platinum group catalyst, was used as the siloxane compound [1], and methylphenyl siloxane having a hydrogen atom bonded to a Si atom was used as the siloxane compound [2]. The methylphenyl siloxane having addition reactive carbon-carbon double bonds at both ends is represented by chemical formula (1001) below, and the methylphenyl siloxane having a hydrogen atom bonded to a Si atom is represented by chemical formula (1002) below. The resultant siloxane-crosslinked product is represented by chemical formula (1003) below in which "a" is any desired integer.

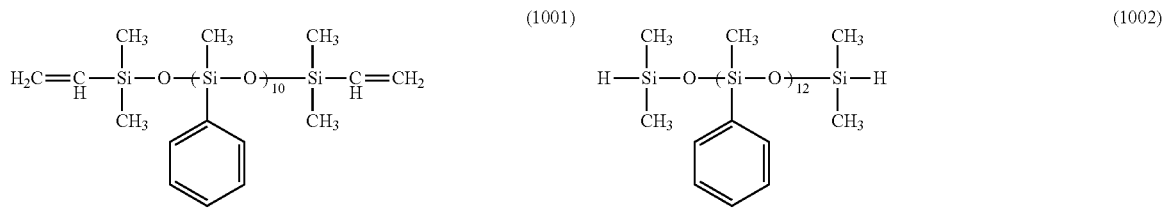
(1001)     (1002)

-continued

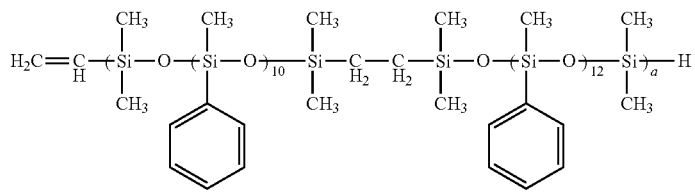

(1003)

First, 1 g of ZrO$_2$ nanoparticles having a particle diameter of 5 nm and synthesized by a sol-gel method was mixed in 10 ml of MEK, and then 1 g of 4-phenoxybenzoic acid was added to the resultant mixture, followed by dispersion by stirring with a disper at room temperature. Next, 40 ml of ethanol was added to the resultant dispersion, and precipitates were collected by centrifugal separation. Then, 10 ml of MEK was added to the precipitates, and the precipitates were disintegrated with a disper. Then, 40 ml of ethanol was added, and the inorganic nanoparticles were again precipitated by centrifugal separation and collected as precipitates. The operation of washing and centrifugal separation was repeated three times, and then the precipitates were recovered and dried under vacuum to obtain ZrO$_2$ nanoparticles with the surfaces coated with 4-phenoxybenzoic acid. In the description below, the expression that the particle diameter of the inorganic nanoparticles is D nm means that the value of ($D_{ave}+2\sigma$) does not exceed D nm, wherein $D_{ave}$ is the average particle diameter of the inorganic nanoparticles and a is the standard deviation.

Next, a predetermined amount of the ZrO$_2$ nanoparticles was added to toluene and dispersed in toluene with a disper, and methylphenyl siloxane ($n_D$=1.53, viscosity=250 mPa·s) having addition reactive carbon-carbon double bonds at both ends was added to the resultant dispersion so that the volume filling ratio of the ZrO$_2$ nanoparticles was 10%. Furthermore, a vinylsiloxane complex of Pt was added as a platinum group catalyst in an amount of 10 ppm in terms of Pt weight relative to methylphenyl siloxane, followed by uniform mixing using a stirrer. Then, toluene was removed from the resultant mixture with an evaporator (set temperature 40° C.) to obtain a mixture [1] containing the ZrO$_2$ nanoparticles as the inorganic nanoparticles coated with 4-phenoxybenzoic acid used as the organic compound and methylphenyl siloxane used as the siloxane compound [1] to which the platinum group catalyst was added.

On the other hand, a predetermined amount of the ZrO$_2$ nanoparticles was added to toluene and dispersed in toluene with a disper, and methylphenyl siloxane (nD=1.52, viscosity=400 mPa·s) having a hydrogen atom bonded to a Si atom was added to the resultant dispersion so that the volume filling ratio of the ZrO$_2$ nanoparticles was 10%. The resultant mixture was uniformly mixed using a stirrer. Then, toluene was removed from the resultant mixture with an evaporator (set temperature 40° C.) to obtain a mixture [2] containing the ZrO$_2$ nanoparticles as the inorganic nanoparticles coated with 4-phenoxybenzoic acid used as the organic compound and methylphenyl siloxane used as the siloxane compound [2].

Next, the mixtures [1] and [2] were mixed at a weight ratio of 1:1. The resultant mixture of the mixtures [1] and [2] is referred to as the "nanoparticle-resin composite material precursor". The mixture was defoamed by stirring and heated at 150° C. for 5 hours in air to crosslink the siloxane compounds [1] and [2] and form the siloxane-crosslinked product. As a result, a nanoparticle-resin composite material was obtained.

The refractive index of the nanoparticle-resin composite material precursor was measured with an Abbe refractometer (manufactured by ATAGO Co., Ltd.; Model No. NAR-4T) at the D-line wavelength. Furthermore, the nanoparticle-resin composite material precursor was sealed in a quartz cell having an optical length of 0.5 mm and cured by heating at 150° C. for 5 hours in air to produce a nanoparticle-resin composite material. The transmittance of the nanoparticle-resin composite material was measured with a UV-visible spectrophotometer (manufactured by Hitachi High-Technologies Corporation; Model No. U-3410).

Figure 2:
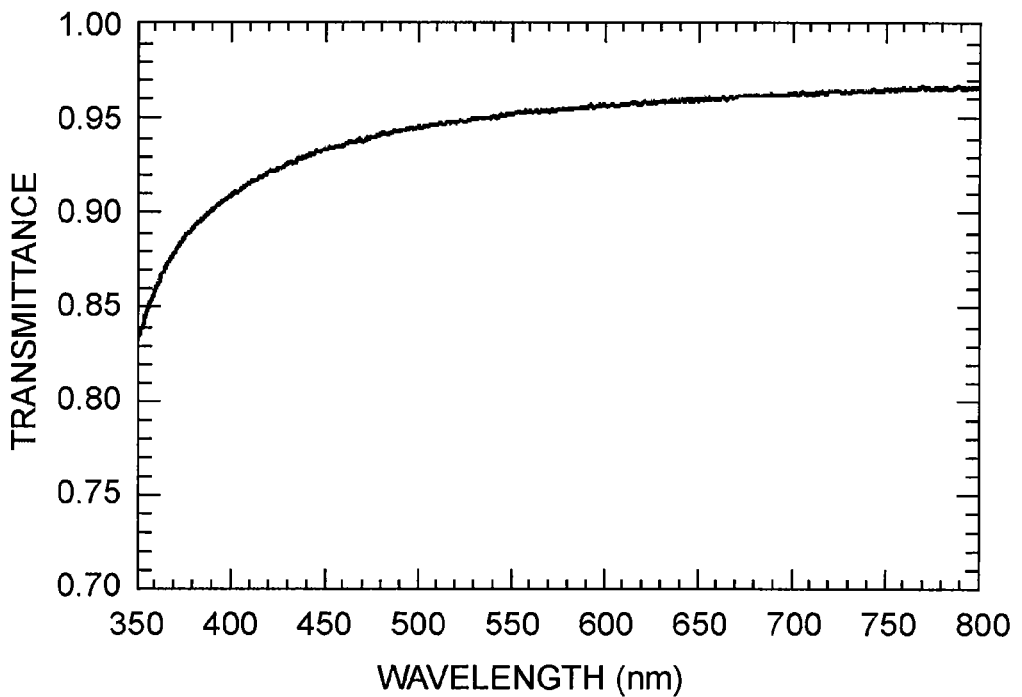
FIG. 2 is a graph showing the results of measurement of the light transmittance of a nanoparticle-resin composite material with a UV-visible spectrophotometer in Example 10.
Figure 4:
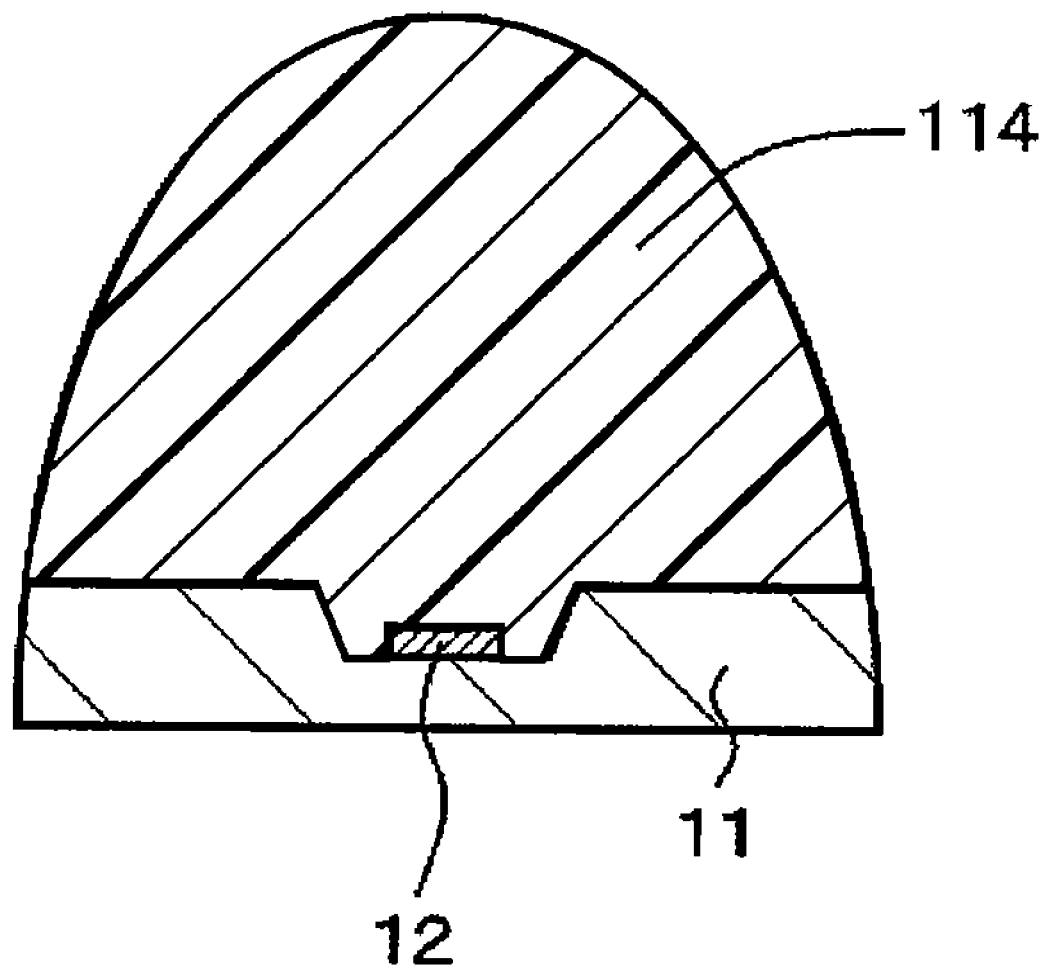
FIG. 4 is a schematic sectional view showing a light-emitting device assembly of Example 13 or a usual light-emitting device assembly.

The refractive index of the nanoparticle-resin composite material precursor measured at the D-line wavelength was 1.59. As seen from the measurement results shown in FIG. 2, the light transmittance of the nanoparticle-resin composite material of Example 10 was 85% or more in the visible wavelength region from 380 nm to 750 nm. In addition, as described below, a light-emitting device assembly including a blue light-emitting diode used as a light-emitting device having an emission wavelength of 455 nm according to the third embodiment was experimentally formed, and the luminance was measured. As a result, the luminance was improved by 10% on the basis of a usual light-emitting device assembly (including a sealing member 114 having a refractive index of 1.5) shown in FIG. 4. The usual light-emitting device assembly (including a sealing member having a refractive index of 1.5) shown in FIG. 4 is referred to as a "usual product".

In the examples described below, the refractive index was measured at the D-line wavelength, and the light transmittance was measured using a quartz cell having an optical length of 0.5 mm in the visible wavelength region from 380 nm to 750 nm.

As modifications of Example 10, Examples 10-A to 10-C which will be described below were performed. The organic compounds used in Examples 10-A to 10-C were as shown below. The siloxane compound [1], the siloxane compound [2], and the platinum group catalyst were the same as those in Example 10. The reflective indexes, light transmittance, and states of the resultant nanoparticle-resin composite materials are shown in Table 4.

[Organic Compound]

Example 10: an aryloxy group-containing carboxylic acid, 4-phenoxybenzoic acid, denoted by symbol "1 " in the column of "Organic compound" in Table 4.

Example 10-A: an aryl group-containing carboxylic acid, 4-phenylbutyric acid, denoted by symbol "1-A" in the column of "Organic compound" in Table 4.

Example 10-B: an aryl group-containing phosphinic acid, diphenylphosphinic acid, denoted by symbol "1-B" in the column of "Organic compound" in Table 4.

Example 10-C: 4-phenylbutyltrichlorosilane denoted by symbol "1-C" in the column of "Organic compound" in Table 4.

Example 11: an olefin chain-containing carboxylic acid, oleic acid, denoted by symbol "2" in the column of "Organic compound" in Table 4.

In Example 10 and Examples 10-A to 10-C, the platinum group catalyst may be added to the siloxane compound [2] instead of being added to the siloxane compound [1]. In this case, the characteristics of the finally resultant nanoparticle-resin composite material were the same as described above.

EXAMPLE 11

Example 11 is a modification of Example 10. The nanoparticle-resin composite material and the method for producing the same of Example 11 will be described in detail below. More specifically, in Example 11, an olefin chain-containing carboxylic acid, oleic acid, was used as the organic compound, methylphenyl siloxane having addition reactive carbon-carbon double bonds at both ends and substituted by polyether groups at parts of the side chains, to which a vinylsiloxane complex of Pt was added as a platinum group catalyst, was used as the siloxane compound [1], and methylphenyl siloxane having a hydrogen atom bonded to a Si atom and substituted by polyether groups at parts of the side chains was used as the siloxane compound [2]. The methylphenyl siloxane having addition reactive carbon-carbon double bonds at both ends and substituted by polyether groups at parts of the side chains is represented by chemical formula (1101) below, and the methylphenyl siloxane having a hydrogen atom bonded to a Si atom and substituted by polyether groups at parts of the side chains is represented by chemical formula (1102) below. The resultant siloxane-crosslinked product is represented by chemical formula (1103) below in which "b" is any desired integer.

tion and collected as precipitates. The operation of washing and centrifugal separation was repeated three times, and then the precipitates were recovered and dried under vacuum to obtain $ZrO_2$ nanoparticles with the surfaces coated with oleic acid.

Next, a predetermined amount of the $ZrO_2$ nanoparticles was added to toluene and dispersed in toluene with a disper, and methylphenyl siloxane ($n_D$=1.48, viscosity=500 mPa·s) having addition reactive carbon-carbon double bonds at both ends and substituted by polyether groups at parts of the sides chains was added to the resultant dispersion so that the volume filling ratio of the $ZrO_2$ nanoparticles was 14%. Furthermore, a vinylsiloxane complex of Pt was added as a platinum group catalyst in an amount of 10 ppm in terms of Pt weight relative to methylphenyl siloxane, followed by uniform mixing using a stirrer. Then, toluene was removed from the resultant mixture with an evaporator (set temperature 40° C.) to obtain a mixture [1] containing the $ZrO_2$ nanoparticles as the inorganic nanoparticles coated with oleic acid used as the organic compound and methylphenyl siloxane used as the siloxane compound [1] to which the platinum group catalyst was added.

On the other hand, a predetermined amount of the $ZrO_2$ nanoparticles was added to toluene and dispersed in toluene with a disper, and methylphenyl siloxane ($n_D$=1.48, viscosity=1000 mPa·s) having a hydrogen atom bonded to a Si atom and substituted by polyether groups at parts of the side chains was added to the resultant dispersion so that the volume filling ratio of the $ZrO_2$ nanoparticles was 14%. The resultant mix-

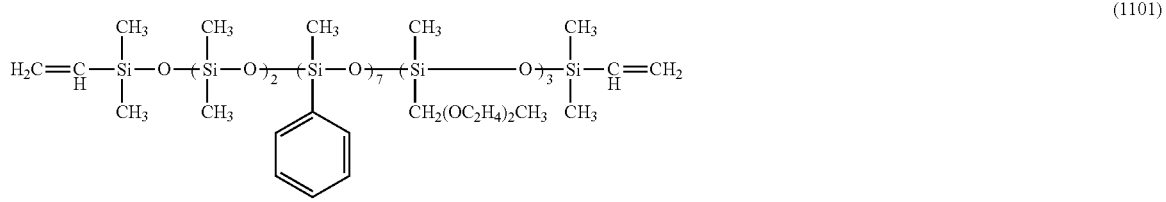

(1101)

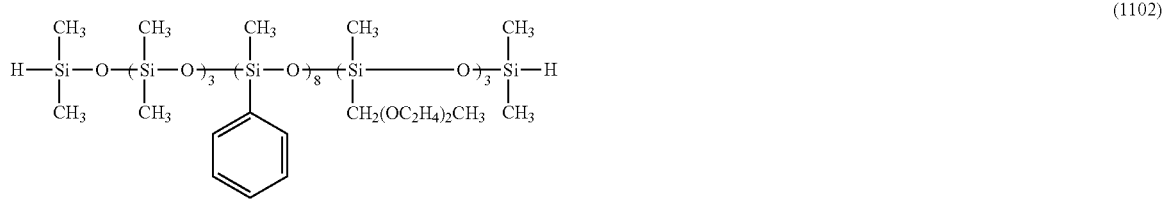

(1102)

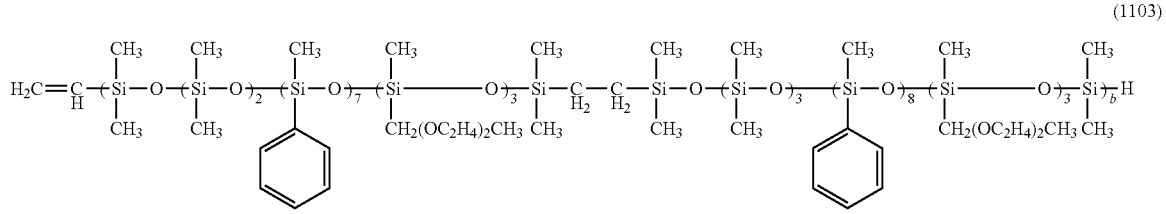

(1103)

First, 1 g of $ZrO_2$ nanoparticles having a particle diameter of 5 nm and synthesized by a sol-gel method was mixed in 10 ml of toluene, and then 1 g of oleic acid was added to the resultant mixture, followed by dispersion by stirring with a disper at room temperature. Next, 40 ml of ethanol was added to the resultant dispersion, and precipitates were collected by centrifuigal separation. Then, 10 ml of toluene was added to the precipitates, and the precipitates were dispersed with a disper. Then, 40 ml of ethanol was added, and the inorganic nanoparticles were again precipitated by centrifugal separature was uniformly mixed using a stirrer. Then, toluene was removed from the resultant mixture with an evaporator (set temperature 40° C.) to obtain a mixture [2] containing the $ZrO_2$ nanoparticles as the inorganic nanoparticles coated with oleic acid used as the organic compound and methylphenyl siloxane used as the siloxane compound [2].

Next, the mixtures [1] and [2] were mixed at a weight ratio of 1:1. The resultant nanoparticle-resin composite material precursor was stirred, defoamed, and then heated at 150° C. for 5 hours in air to crosslink the siloxane compounds [1] and

[2] and form the siloxane-crosslinked product. As a result, a nanoparticle-resin composite material was obtained.

The refractive index of the nanoparticle-resin composite material precursor was 1.57, and the light transmittance was 85% or more in the visible wavelength region. In addition, a light-emitting device assembly including a blue light-emitting device exhibited an increase of 7% in luminance relative to the usual product. The results of Example 11 are summarized in Table 4.

EXAMPLE 12

Example 12 relates to a light-emitting device assembly according to the embodiment 1A, a light-emitting device assembly including the nanoparticle-resin composite material according to the first or second embodiment of the invention, a filling material for a light-emitting device assembly according to another embodiment, a filling material for a light-emitting device assembly including the nanoparticle-

TABLE 4

| | Example | | | | |
|---|---|---|---|---|---|
| | 1 | 1-A | 1-B | 1-C | 2 |
| | Nanoparticles | | | | |
| Composition | $ZrO_2$ | $ZrO_2$ | $ZrO_2$ | $ZrO_2$ | $ZrO_2$ |
| Average particle diameter (nm) | 5 | 5 | 5 | 5 | 5 |
| Refractive index | 2.2 | 2.2 | 2.2 | 2.2 | 2.2 |
| | Organic compound | | | | |
| Composition | 1 | 1-A | 1-B | 1-C | 2 |
| Molecular weight | 214 | 164 | 219 | 268 | 282 |
| | Siloxane compound [1] | | | | |
| Composition | Methylphenyl siloxane | Methylphenyl siloxane | Methylphenyl siloxane | Methylphenyl siloxane | Polyether-substituted methylphenyl siloxane |
| Molecular weight | 1549 | 1549 | 1549 | 1549 | 1547 |
| Refractive index | 1.53 | 1.53 | 1.53 | 1.53 | 1.48 |
| Viscosity (Pa · s) | 0.25 | 0.25 | 0.25 | 0.25 | 0.50 |
| | Siloxane compound [2] | | | | |
| Composition | Methylphenyl siloxane | Methylphenyl siloxane | Methylphenyl siloxane | Methylphenyl siloxane | Polyether-substituted methylphenyl siloxane |
| Molecular weight | 1769 | 1769 | 1769 | 1769 | 1702 |
| Refractive index | 1.52 | 1.52 | 1.52 | 1.52 | 1.48 |
| Viscosity (Pa · s) | 0.40 | 0.40 | 0.40 | 0.40 | 1.0 |
| | Nanoparticle-resin composite material | | | | |
| Refractive index | 1.59 | 1.58 | 1.59 | 1.58 | 1.57 |
| Transmittance (% or more) | 85 | 85 | 85 | 85 | 85 |
| linear expansion coefficient (×10−6) | 120 | 120 | 120 | 120 | 130 |
| Volume filling ratio (%) | 10 | 10 | 10 | 10 | 14 |
| | Light-emitting device assembly | | | | |
| Improvement in luminance (%) | 10 | 9 | 10 | 10 | 7 |

(Note) Organic compound composition:
Composition 1: 4-phenoxybenzoic acid
Composition 1-A: 4-phenylbutyric acid
Composition 1-B: diphenylphosphinic acid
Composition 1-C: 4-phenylbutyltrichlorosilane
Composition 2: oleic acid

COMPARATIVE EXAMPLE 2

Figure 3A:
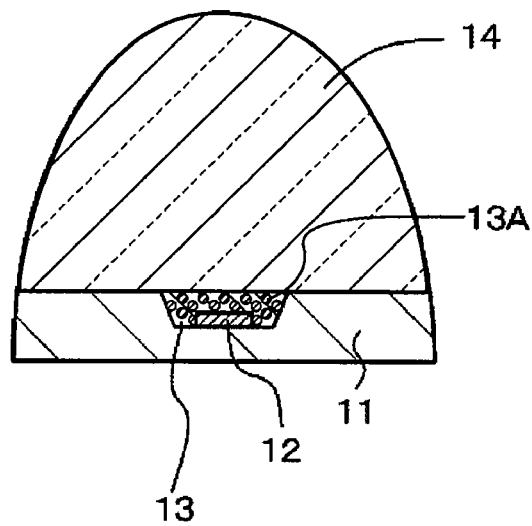
FIG. 3A is a schematic sectional view showing a light-emitting device assembly of Example 12.

A nanoparticle-resin composite material was prepared by processing under the same conditions as in Example 10 except that the organic compound was not used. In the resultant nanoparticle-resin composite material, the $ZrO_2$ nanoparticle significantly aggregated, the transmittance was 1% or less over the entire visible region, and the refractive index could not be measured.

resin composite material according to the first or second embodiment, and an optical material according to a further embodiment. FIG. 3A is a schematic sectional view showing a light-emitting device assembly of Example 12. The light-emitting device assembly includes:

(a) a light-emitting device (light-emitting diode) 12;

(b) a sealing member 14 for sealing the light-emitting device; and (c) a filling material 13 filling in the space between the light-emitting device 12 and the sealing member 14 and composed of a nanoparticle-resin composite material.

The nanoparticle-resin composite material (filling material for the light-emitting device assembly) or the optical material is composed of the nanoparticle-resin composite material 13A of any one of Examples 1 to 11.

More specifically, the light-emitting device assembly includes a reflection cup 11 having a recess (corresponding to the space), the light-emitting device 12 disposed in the recess of the reflection cup 11, the filling material 13 composed of the nanoparticle-resin composite material 13A filling in the recess to seal the light-emitting device 12, and the sealing member 14 composed of a shell-shaped transparent material (for example, a polycarbonate resin having a refractive index of 1.6) and disposed as a cover for the recess of the reflection cup 11 so as to seal the light-emitting device 12 and the nanoparticle-resin composite material 13A.

In the light-emitting device assembly of Example 12, the nanoparticle-resin composite material 13A having transparency and a high refractive index is used as the filling material (sealing material) 13, and thus it may be possible to prevent, as much as possible, light emitted from the light-emitting device 12 from being totally reflected at the interface between the light-emitting device 12 and the filling material 13. Also, it may be possible to prevent, as much as possible, light emitted from the light-emitting device 12 from being totally reflected at the interface between the filling material 13 and the sealing member 14, thereby improving the efficiency of light emission. In addition, the nanoparticle-resin composite material 13A according to the first or second embodiment of the invention is liquid, and thus the nanoparticle-resin composite material 13A does not exert a force to disconnect wiring (not shown in the drawing) connected to the light-emitting device 12 even when heated to a high temperature due to the operation of the light-emitting device 12. Furthermore, the nanoparticle-resin composite material 13A has high light resistance and thus imparts high durability to the light-emitting device assembly. Since the nanoparticle-resin composite material 13A according to the third embodiment of the invention is a solid or gel, the nanoparticle-resin composite material 13A does not flow out from the light-emitting device assembly due to an increase in fluidity even when heated to a high temperature by the operation of the light-emitting device, thereby securing long-term reliability of the light-emitting device assembly.

When the light-emitting device assembly of Example 12 is used as a light source of a planar light source device (back light) of a liquid crystal device, the emission of light from the light-emitting diode serving as the light-emitting device only in the z-axis direction may cause luminance variation in the planar light source device. In order to avoid such a phenomenon, a light-emitting diode assembly including a light-emitting diode and a light emitting lens provided as a sealing member on the light-emitting diode may be used as a light source to achieve a two-dimensional emission system in which light emitted from the light-emitting diode is totally reflected at the top surface of the light-emitting lens and mainly emitted in the horizontal direction of the light-emitting lens.

Figure 3B:
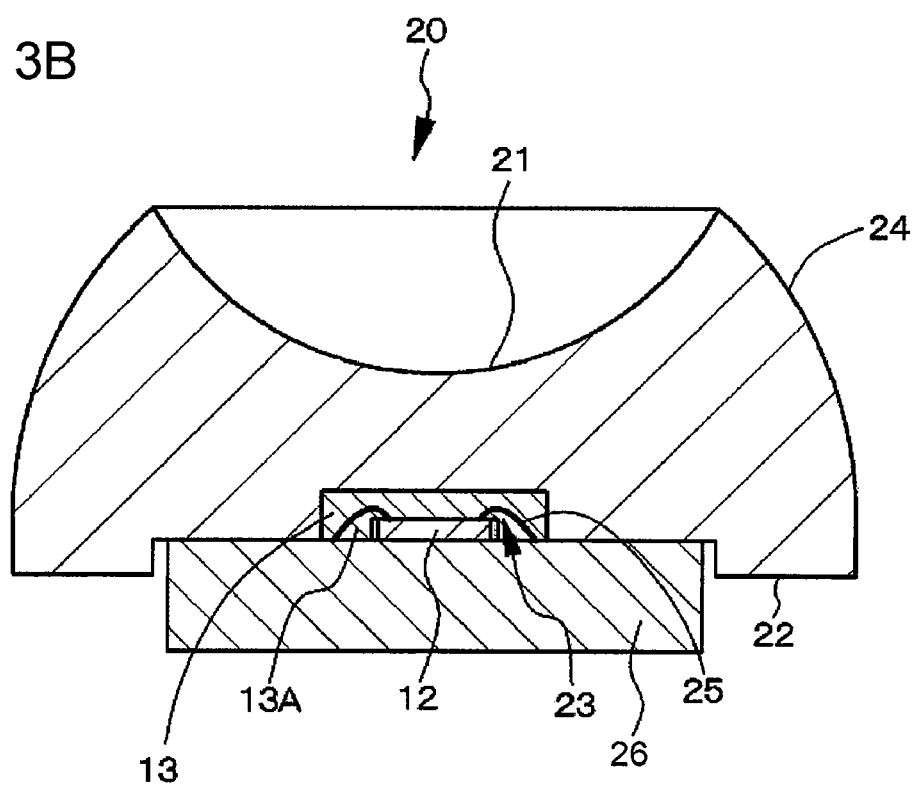
FIG. 3B is a schematic sectional view showing a light-emitting device assembly of Example 12 provided with a light-emitting lens.

More specifically, as shown in a conceptual view of FIG. 3B, a light-emitting device assembly including a light-emitting device (light-emitting diode) 12 and a light-emitting lens 20 provided thereon is used as a light source to achieve a two-dimensional emission system in which light emitted from the light-emitting device 12 is totally reflected at a portion of the top surface 21 of the light-emitting lens 20 and mainly emitted in the horizontal direction of the light-emitting lens 20. In FIG. 3B, reference numeral 22 denotes the bottom of the light-emitting lens 20, and reference numeral 24 denotes the side of the light-emitting lens 20. The bottom 22 of the light-emitting lens 20 has a recess (space) 23 in which the light-emitting device 12 is contained. The recess 23 is filled with the filling material 13 composed of the nanoparticle-resin composite material 13A. Reference numeral 26 denotes a substrate, and reference numeral 25 denotes wiring for connecting the light-emitting device 12 and a wiring part (not shown) provided on the substrate 26. As the material of the light-emitting lens 20, the transparent material for the above-described sealing member 14 may be used.

The light-emitting lens shown in FIG. 3B is disclosed in Japanese Application No. 2005-300117 and includes the circular bottom 22, the side 24, and the top surface 21, a planar light source (the light-emitting device 12) having a finite size being disposed at the center of the bottom 22. On the assumption of cylindrical coordinates $(r, \phi, z)$ in which the center of the bottom 22 is an origin and the normal line passing through the center of the bottom 22 is the z axis, the top surface 21 includes an aspheric surface rotationally symmetric with respect to the z axis, for totally reflecting a portion of an emitted light component, which has a polar angle smaller than the polar angle $\Theta_0$ in the intersecting portion of the side 24 and the top surface 21, among the half panoramic radiant light emitted from the planar light source. The side 24 includes an aspheric surface rotationally symmetric with respect to the z axis, for transmitting an emitted light component having a polar angle larger than the polar angle $\Theta_0$ and an emitted light component totally reflected by the top surface 21, among the half panoramic radiant light emitted from the planar light source. In a closed interval of $0 \leq z \leq z_1$ wherein $z_1$ is the z coordinate of the intersecting portion of the side 24 and the top surface 21, the function $r=f_s(z)$ in which z indicating the side 24 including an aspheric surface is a variable monotonically increases as z decreases. Also, in this closed interval, there is at least one point at which the absolute value of derivative of the second order of z is maximized.

However, the light-emitting lens is not limited to the light-emitting lens 20 shown in FIG. 3B, and a light-emitting lens having any configuration and structure may be used.

In the light-emitting device assembly, an antifouling layer may be formed on the surfaces of the sealing member 14 or the light-emitting lens 20.

Specifically, 2 parts by weight of a fluorocarbon resin, e.g., an alkoxysilane compound (represented by the chemical formula given below with an average molecular weight of about 4000) having perfluoropolyether groups at both ends, was dissolved in 200 parts by weight of a fluorocarbon solvent, e.g., hydrofluoropolyether (manufactured by Solvay Solexis Co., Ltd., trade name H-GALDEN) having a boiling point of 130° C. Furthermore, 0.08 parts by weight of perfluoropolyether ester of phosphoric acid was added as a catalyst to the resultant solution to form a homogeneous solution. Then, the solution was filtered with a membrane filter to prepare a composition for forming the antifouling layer. The composition for forming the antifouling layer was applied onto the surface of the sealing member 14 using a spray and then dried at a temperature of 70° C. for 1 hour to obtain a light-emitting device assembly including the sealing member 14 and the antifouling layer formed on the surface thereof.

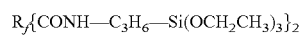

$$R_f\{CONH-C_3H_6-Si(OCH_2CH_3)_3\}_2$$

Furthermore, an attempt was made to sprinkle cone starch on the sealing member 14 of the resultant light-emitting device assembly and then remove the cone starch with an air gun. As a result of observation of the surface of the sealing member 14 through an optical microscope, the cone starch was completely removed.

On the other hand, a light-emitting device assembly was formed by the same method as described above except that a resin (average molecular weight, about 2000) represented by the chemical formula below was used as a fluorocarbon resin. Furthermore, an attempt was made to sprinkle cone starch on the sealing member 14 of the resultant light-emitting device assembly and then remove the cone starch with an air gun. As a result of observation of the surface of the sealing member 14 through an optical microscope, the cone starch was completely removed.

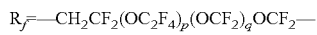

$R_f\text{—}CH_2CF_2(OC_2F_4)_p(OCF_2)_qOCF_2\text{—}$

Furthermore, a light-emitting device assembly was formed by the same method as described above except that a resin (average molecular weight, about 650) represented by the chemical formula below was used as a fluorocarbon resin. Also, an attempt was made to sprinkle cone starch on the sealing member 14 of the resultant light-emitting device assembly and then remove the cone starch with an air gun. As a result of observation of the surface of the sealing member 14 through an optical microscope, the cone starch was completely removed.

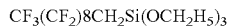

$CF_3(CF_2)_8CH_2Si(OCH_2H_5)_3$

EXAMPLE 13

Example 13 relates to a light-emitting device assembly according to the embodiment 1B, a filling material for a light-emitting device assembly according to another embodiment, and an optical material according to a further embodiment. The schematic sectional view of a light-emitting device assembly of Example 13 is the same as FIG. 4 showing a usual light-emitting device assembly. Namely, the light-emitting device assembly of Example 13 shown in the schematic sectional view of FIG. 4 includes the following:

(a) a light-emitting device (light-emitting diode) 12; and
(b) a sealing member 34 for sealing the light-emitting device 12 and composed of a nanoparticle-resin composite material. The nanoparticle-resin composite material (filling material for the light-emitting device assembly) or the optical material is composed of the nanoparticle-resin composite material 13A of any one of Examples 10 and 11.

More specifically, the light-emitting device assembly includes a reflection cup 11 having a recess (corresponding to the space), the light-emitting device 12 disposed in the recess of the reflection cup 11, and the sealing member 34 disposed to seal the light-emitting device 12.

In the light-emitting device assembly of Example 13, the nanoparticle-resin composite material 13A having transparency and a high refractive index is used for forming the sealing member 34, and thus it may be possible to prevent, as much as possible, light emitted from the light-emitting device 12 from being totally reflected at the interface between the light-emitting device 12 and the sealing member 34, thereby improving the efficiency of light emission.

Instead of the sealing member 34, the light-emitting lens described in Example 12 which is composed of the nanoparticle-resin composite material of any one of Examples 10 and 11 may be provided to form a light-emitting diode assembly. Also, the antifouling layer described in Example 12 may be formed on the surface of the sealing member 34.

It should be understood by those skilled in the art that various modifications, combinations, sub-combinations and alterations may occur depending on design requirements and other factors insofar as they are within the scope of the appended claims or the equivalents thereof.

What is claimed is:

1. A nanoparticle-resin composite material having a transparent characteristic and a refractive index of at least 1.55 in the visible light region, the material comprising:
   inorganic nanoparticles dispersed in a polymer having a siloxane bond, the inorganic nanoparticles being coated with an organic compound;
   wherein the organic compound is at least one compound selected from the group consisting of carboxylic acids, phosphinic acid, phosphonic acid, sulfinic acid, sulfonic acid, and thiols;
   wherein the organic compound includes an aryl group or an aryloxy group; and
   wherein the polymer is selected from the group consisting of a methylphenyl polysiloxane based polymer, a methylphenyl hydrogen polysiloxane based polymer, and a mixture of the methylphenyl polysiloxane based polymer and the methylphenyl hydrogen polysiloxane based polymer,
   wherein parts of the side chains and/or terminals of the methylphenyl polysiloxane based polymer and the methylphenyl hydrogen polysiloxane based polymer are substituted by epoxy groups, carboxyl groups, carbinol groups, methacryl groups, polyether groups, or vinyl groups.

2. The nanoparticle-resin composite material according to claim 1, wherein the polymer is a liquid.

3. A nanoparticle-resin composite material having a transparent characteristic and a refractive index of at least 1.55 in the visible light region, the material comprising:
   inorganic nanoparticles dispersed in a siloxane-crosslinked product, the inorganic nanoparticles being coated with an organic compound;
   wherein the siloxane-crosslinked product is a product in which a first siloxane compound having an addition reactive carbon-carbon double bond is crosslinked with a second siloxane compound having a hydrogen atom bonded to a silicon atom,
   wherein the organic compound is at least one compound selected from the group consisting of carboxylic acids, phosphinic acid, phosphonic acid, sulfinic acid, sulfonic acid, and thiols, and
   wherein the organic compound includes an aryl group or an aryloxy group.

4. The nanoparticle-resin composite material according to claim 3, wherein the inorganic nanoparticles have a refractive index of at least 1.9 in the visible light region.

5. The nanoparticle-resin composite material according to claim 3, wherein the inorganic nanoparticles are composed of at least one material selected from the group consisting of titanium oxide, zirconium oxide, cerium oxide, hafnium oxide, niobium pentoxide, tantalum pentoxide, indium oxide, tin oxide, ITO, zinc oxide, and silicon.

6. The nanoparticle-resin composite material according to claim 3, wherein the particle diameter of the inorganic nanoparticles ranges from about $2\times10^{-9}$ m to about $2\times10^{-8}$ m.

7. The nanoparticle-resin composite material according to claim 3, wherein the first siloxane compound has a structural formula represented by one of formulae (3-12), (3-13), (3-14) and (3-15) shown below:

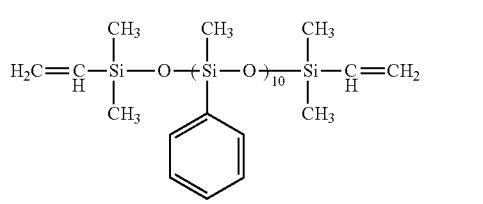
(3-12)

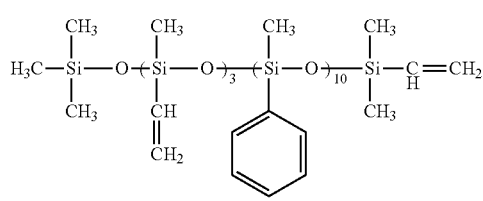
(3-13)

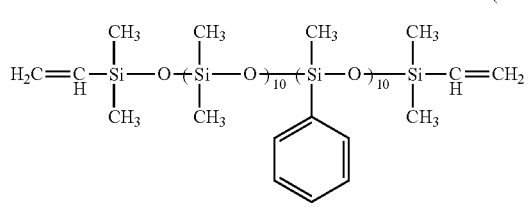
(3-14)

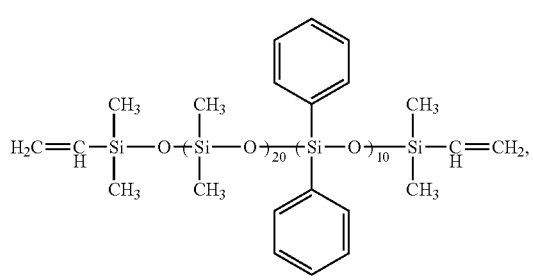
(3-15)

and wherein the second siloxane compound has a structural formula represented by one of formulae (3-22), (3-23), (3-24) and (3-25) shown below:

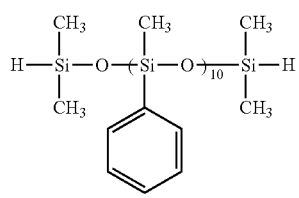
(3-22)

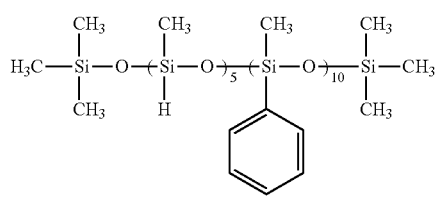
(3-23)

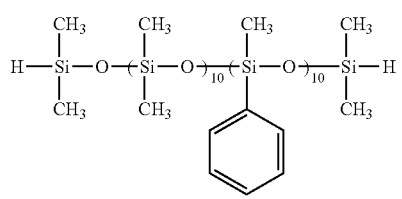
(3-24)

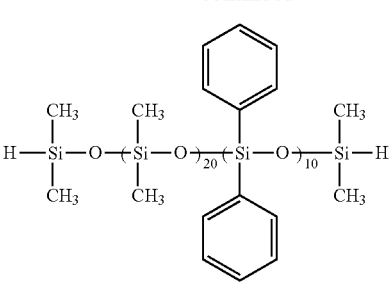
(3-25)

8. The nanoparticle-resin composite material according to claim 3, wherein one of the first and second siloxane compounds includes a platinum group catalyst.

9. The nanoparticle-resin composite material according to claim 8, wherein in one of the first and second siloxane compounds, parts of the side chains and/or the terminals are substituted by epoxy groups, carboxyl groups, polyether groups, or carbinol groups.

10. The nanoparticle-resin composite material according to claim 8, wherein the first siloxane compound includes the platinum group catalyst, and wherein a first mixture of the first siloxane compound containing the platinum group catalyst and the inorganic nanoparticles coated with the organic compound and a second mixture of the second siloxane compound and the inorganic nanoparticles coated with the organic compound are mixed, and the resultant mixture is heated to produce the siloxane-crosslinked product.

11. The nanoparticle-resin composite material according to claim 8, wherein the second siloxane compound includes the platinum group catalyst, and wherein a first mixture of the first siloxane compound and the inorganic nanoparticles coated with the organic compound and a second mixture of the second siloxane compound containing the platinum group catalyst and the inorganic nanoparticles coated with the organic compound are mixed, and the resultant mixture is heated to produce the siloxane-crosslinked product.

12. The nanoparticle-resin composite material according to claim 8, wherein one of the first and second siloxane compounds is a linear or cyclic diorganopolysiloxane where in addition to the addition reactive carbon-carbon double bond or the hydrogen atom bonded to a silicon atom, a phenyl group and a monovalent hydrocarbon group other than a phenyl group are present at the side chains or the terminals.

13. The nanoparticle-resin composite material according to claim 12, wherein in one of the first and second siloxane compounds, parts of the side chains and/or the terminals are substituted by epoxy groups, carboxyl groups, polyether groups, or carbinol groups.

14. A light-emitting device assembly comprising:
a light-emitting device;
a sealing member for sealing the light-emitting device; and
a filling material in a space between the light-emitting device and the sealing member;
wherein the filling material is composed of a nanoparticle-resin composite material having a transparent characteristic and a refractive index of at least 1.55 in the visible light region and includes inorganic nanoparticles dispersed in a siloxane-crosslinked product, the inorganic nanoparticles being coated with an organic compound;
wherein the siloxane-crosslinked product is a product in which a first siloxane compound having an addition reactive carbon-carbon double bond is crosslinked with a second siloxane compound having a hydrogen atom bonded to a silicon atom, and wherein the organic compound is at least one compound selected from the group consisting of carboxylic acids, phosphinic acid, phosphonic acid, sulfinic acid, sulfonic acid, and thiols, and wherein the organic compound includes an aryl group or an aryloxy group.

15. A light-emitting device assembly comprising:

a light-emitting device; and a sealing member for sealing the light-emitting device;

wherein the sealing member is composed of a nanoparticle-resin composite material having a transparent characteristic and a refractive index of at least 1.55 in the visible light region and includes inorganic nanoparticles dispersed in a siloxane-crosslinked product, the inorganic nanoparticles being coated with an organic compound, wherein the siloxane-crosslinked product is a product in which a first siloxane compound having an addition reactive carbon-carbon double bond is crosslinked with a second siloxane compound having a hydrogen atom bonded to a silicon atom, and wherein the organic compound is at least one compound selected from the group consisting of carboxylic acids, phosphinic acid, phosphonic acid, sulfinic acid, sulfonic acid, and thiols, and wherein the organic compound includes an aryl group or an aryloxy group.

16. A filling material comprising:

a nanoparticle-resin composite material, wherein the nanoparticle-resin composite material has a transparent characteristic and a refractive index of at least 1.55 in the visible light region and includes inorganic nanoparticles dispersed in a siloxane-crosslinked product, the inorganic nanoparticles being coated with an organic compound, wherein the siloxane-crosslinked product is a product in which a first siloxane compound having an addition reactive carbon-carbon double bond is crosslinked with a second siloxane compound having a hydrogen atom bonded to a silicon atom, and wherein the organic compound is at least one compound selected from the group consisting of carboxylic acids, phosphinic acid, phosphonic acid, sulfinic acid, sulfonic acid, and thiols, and wherein the organic compound includes an aryl group or an aryloxy group.

* * * * *